(12) United States Patent
Sakai et al.

(10) Patent No.: US 10,516,057 B1
(45) Date of Patent: Dec. 24, 2019

(54) ELECTROWETTING PIXEL WITH INSULATED NOTCH STRUCTURE

(71) Applicant: Amazon Technologies, Inc., Seattle, WA (US)

(72) Inventors: Toru Sakai, Waalre (NL); Abhishek Kumar, Tilburg (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 85 days.

(21) Appl. No.: 15/369,186

(22) Filed: Dec. 5, 2016

(51) Int. Cl.
| | |
|---|---|
| *G02B 26/00* | (2006.01) |
| *H01L 29/786* | (2006.01) |
| *H01L 29/49* | (2006.01) |
| *H01L 29/423* | (2006.01) |
| *G09G 3/34* | (2006.01) |
| *G06F 3/041* | (2006.01) |

(52) U.S. Cl.
CPC ...... *H01L 29/78633* (2013.01); *G02B 26/005* (2013.01); *H01L 29/42384* (2013.01); *H01L 29/4908* (2013.01); *H01L 29/78648* (2013.01); *H01L 29/78651* (2013.01); *H01L 29/78681* (2013.01); *H01L 29/78684* (2013.01); *H01L 29/78696* (2013.01); *G02B 2207/115* (2013.01); *G06F 3/041* (2013.01); *G09G 3/348* (2013.01)

(58) Field of Classification Search
CPC ........... G02F 1/13306; G02F 1/133753; G02F 1/13452; G02F 1/136213; G02F 1/136286; G02F 1/1368; G02F 1/1393; G02F 2001/133622; G02F 2202/103; H01L 27/1225; H01L 27/124; H01L 27/1255; H01L 21/67167; H01L 2251/5307; H01L 2251/5315; H01L 2251/5323; H01L 27/06; H01L 27/1222; H01L 27/15; H01L 27/156; H01L 27/3211; H01L 27/3213; H01L 27/3216
USPC ................ 359/237, 265–267, 242, 270–273, 359/290–292, 295, 298
See application file for complete search history.

(56) References Cited

U.S. PATENT DOCUMENTS

2005/0117108 A1* 6/2005 Kume ............... G02F 1/133707
349/156
2016/0336385 A1* 11/2016 Li ....................... H01L 27/3258

* cited by examiner

*Primary Examiner* — Brandi N Thomas
(74) *Attorney, Agent, or Firm* — Quarles and Brady LLP

(57) ABSTRACT

An electrowetting display device is presented. The device includes a support plate and a plurality of pixel walls over the support plate. The plurality of pixel walls are associated with an electrowetting pixel. The device includes a switch over the support plate. The switch includes a first terminal. The device includes an electrode over the support plate. The electrode is electrically connected to the first terminal of the switch. The electrode defines a notch region extending from a first end of the electrode towards a first pixel wall in the plurality of pixel walls. The device includes an insulated notch structure that includes a dielectric layer. The insulated notch structure is over at least a portion of the switch and at least a portion of the notch region.

19 Claims, 11 Drawing Sheets

US 10,516,057 B1

ELECTROWETTING PIXEL WITH INSULATED NOTCH STRUCTURE

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1A:
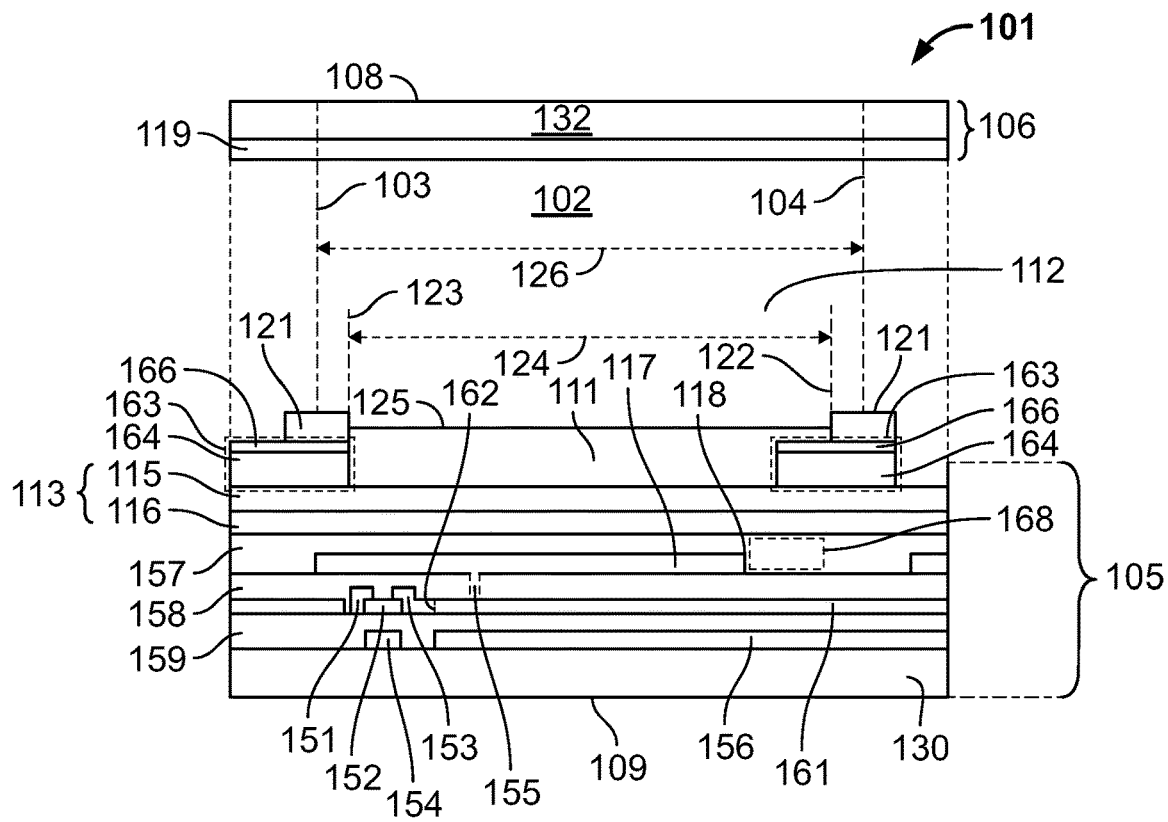
FIGS. 1A and 1B illustrate cross sectional views of a portion of an example electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and a cover layer component, which may include antiglare properties, antireflective properties, anti-fingerprint properties, anti-cracking properties, and the like.

An electrowetting display includes a number of electrowetting pixels fabricated over a first or bottom support plate. Each electrowetting pixel is associated with a number of pixel walls. The pixel walls are configured to define a volume containing at least a portion of a first fluid, such as a black opaque oil. Light transmission through the electrowetting pixels can be controlled by an application of an electric potential or driving voltage to the electrowetting pixels, which results in a movement of a second fluid, such as an electrolyte solution, into or within the electrowetting pixels, thereby displacing the oil.

When an electrowetting pixel is in a rest state (i.e., with no driving voltage applied or at a driving voltage that falls below a threshold value causing the electrowetting pixel to be inactive), the oil is distributed throughout the pixel. The oil absorbs light and the pixel in this condition appears black. But when the driving voltage is applied, the oil is displaced to one or more sides of the pixel. Light can then enter the electrowetting pixel causing the pixel to appear less dark (e.g., white) to an observer. If the electrowetting display is a reflective display, the bottom of each electrowetting pixel includes a reflective surface. In such a display, light will enter the open pixel, strike the reflective surface at the bottom of the pixel and be reflected out of the pixel. If, however, the electrowetting display is a transmissive display, the bottoms of the pixels are transparent and light entering the open pixels passes through the open pixel and the bottom support plate over which the pixels are formed. If a color filter is incorporated over the pixel, the pixel may appear to have color.

The degree to which the oil is displaced from the oil's resting position affects the pixel's perceived brightness. By manipulating the driving voltage applied to the electronic device's electrowetting pixels, different images can be depicted on a display surface of the electronic device.

To enable accurate image formation in the electrowetting display device, it is generally desirable that the oil and electrolyte fluids move in a predictable manner. Specifically, when a driving voltage is applied to a closed electrowetting pixel, the oil should preferably move or be displaced in a predictable direction within the electrowetting pixel. Generally, an electrowetting pixel's driving voltage is applied to a pixel electrode formed over or within the bottom surface of the pixel. If the electrode is symmetrical within the pixel, the driving voltage is applied equally throughout the electrowetting pixel. Because the driving voltage is applied equally in all regions of the pixel, the electrolyte solution has an equal likelihood of entering different regions of the pixel in response to the driving voltage. This can result in unpredictable oil movement in response to the application of a driving voltage.

To make oil movement more predictable, the pixel electrode may define a notch region formed towards one side of the pixel. A dielectric layer is formed over the notch region of the pixel electrode to form an insulated notch structure. With a driving voltage applied to the pixel electrode, a fringe electric field generated by the pixel's electrode is greater at the end of the pixel electrode nearby the insulated notch structure. Due to the increased fringe electric field effect, the electrolyte fluid will tend to enter the pixel over the insulated notch structure causing predictable oil movement away from the insulated notch structure in a consistent direction.

Generally, the electrowetting pixel's electrode is constructed from a reflective material. As such, light that would otherwise have been reflected by the electrode may pass through the insulated notch structure into the structure underneath the insulated notch structure. For this reason, in conventional electrowetting display devices, the insulated notch structure is preferably located away from the transistor that controls the application of the driving voltage to the pixel's electrode. If the insulated notch structure were to be located over the transistor, light may pass through the notch structure and enter the transistor (and, specifically, the semiconducting channel contained within the transistor). The absorption of light by the semiconducting channel can result in an electrical current being generated within the semiconducting channel. This can in turn cause cross-talk, e.g., capacitive, inductive, or conductive coupling from one part of a pixel to another, or between adjacent pixels, or between the pixel and other components within a display device, such as other control circuitry. Additionally, the current induced in the semiconducting channel can cause the transistor to leak current causing the pixel's driving voltage to dissipate over time. All of these effects can result in visual artifacts and, as such, in conventional designs, an insulated notch structure is generally located at an opposite end of the electrowetting pixel from the pixel's transistor. But this configuration can result in another challenge.

When applying a driving voltage to an electrowetting pixel, a control voltage must be applied to a gate terminal of the pixel's transistor. This control voltage is felt by the electrolyte fluid in combination with the driving voltage ultimately applied to the pixel's electrode. The control voltage, although relatively small compared to the driving voltage, can also promote the electrolyte fluid to enter the electrowetting pixel over the pixel's transistor (and, specifically, the gate terminal of the transistor) at the opposite end of the pixel from the pixel's insulated notch structure. Accordingly, the control voltage may, to at least some degree, promote oil movement in opposition to that of the insulated notch structure.

In the present electrowetting pixel, the insulated notch structure is formed at least partially over the pixel's transistor. In this arrangement, both the insulated notch structure and the control voltage applied to the transistor's gate terminal promote oil movement within the electrowetting pixel in the same direction and do not work against one another. To reduce light absorption by the portion of the transistor's semiconducting channel, the present electrowetting pixel may utilize a dual-gate transistor configuration in which the transistor includes a second gate terminal formed at least partially over the transistor's semiconducting channel. The second gate terminal may include a reflective or light-absorbing material that may prevent light that passes through the insulated notch structure from entering the semiconducting channel to cause the generation of an electrical current therein.

Hereinafter, example embodiments include, but are not limited to, electrowetting displays that include clear, transparent, or semi-transparent top support plates and bottom support plates. The support plates may comprise glass or any of a number of at least partially transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display.

A display device, such as an electrowetting display device, may be a transmissive or reflective display that generally includes an array of pixels configured to be operated by an active matrix addressing scheme. In this disclosure, a pixel may, unless otherwise specified, comprise a single sub-pixel or a pixel that includes two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel may be a red sub-pixel, a green sub-pixel, a blue sub-pixel or a white sub-pixel of a larger pixel or may, in some cases, include a number of sub-pixels. As such, a pixel may be a pixel that is a smallest component, e.g., the pixel does not include any sub-pixels.

Rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) associated with each pixel. The transistors take up a relatively small fraction of the area of each pixel to allow light to efficiently pass through (or reflect from) the display pixel.

In some embodiments, an electrowetting display comprises an array of pixels sandwiched between a bottom support plate and a top support plate. The pixels may be made up of one or more layers of transparent or opaque materials. Herein, describing a pixel or material as being transparent generally means that the pixel or material may transmit or enable the propagation of a relatively large fraction of the light incident upon it. For example, a transparent material or layer may transmit or propagate more than 70% or 80% of the light impinging on its surface, though claimed subject matter is not limited in this respect. In contrast, opaque generally means that the pixel or material may block or inhibit the transmission or propagation of at least a portion of the visible light spectrum incident upon it. For example, a black opaque material or layer may block, absorb, or otherwise prevent the propagation of more than 70% or 80% of the light impinging on its surface, though claimed subject matter is not limited in this respect. In the present disclosure, materials that are described as preventing the propagation of light shall be understood to prevent propagation of at least 70% of the light striking the material. Alternatively, opaque material may be transmissive for a portion of the visible light spectrum and blocking other portions, forming a color filter. Similarly, materials that are described as being transparent or allowing propagation of light shall be understood to transmit or propagate at least 70% of the light striking the material. In this description, the visible light spectrum may include light having a wavelength between 390 nanometers (nm) and 700 nm.

Pixel walls retain at least a first fluid that is electrically non-conductive in the individual pixels. For example, the first fluid may include an opaque or colored oil. References in the present disclosure to an oil shall be understood to refer to any fluid that is electrically non-conductive. Each pixel includes a cavity formed between the support plates that is at least partially filled with the oil (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing in some embodiments. The second fluid is immiscible with the first fluid. Herein, substances are immiscible with one another if the substances do not substantially form a solution.

Individual reflective electrowetting pixels may include a reflective layer on the bottom support plate of the electrowetting pixel, a transparent electrode layer adjacent to the reflective layer, and a hydrophobic layer on the electrode layer. Alternatively, the reflective layer may act as the pixel electrode. Transmissive electrowetting pixels do not include a reflective layer in the stack of layers formed over the bottom support plate and are instead generally transparent. Pixel walls, associated with and formed around each pixel, the hydrophobic layer, and the top support plate at least partially enclose a fluid volume that includes an electrolyte solution and the oil, which is immiscible with the electrolyte solution. An "opaque" fluid, as described herein, is used to describe a fluid that appears black or to have color to an observer. For example, an opaque fluid appears black to an observer when it strongly absorbs a broad spectrum of wavelengths (e.g., including those of red, green and blue light) in the visible region of light or electromagnetic radiation. In some embodiments, the opaque fluid is a non-polar electrowetting oil.

The opaque fluid is disposed in the fluid region. A coverage area of the opaque fluid on the bottom hydrophobic layer is electrically adjustable to affect the amount of light incident on the electrowetting display that reaches the reflective material at the bottom of each reflective pixel or that passes through each transmissive pixel.

In addition to pixels, pixel spacers and edge seals may also be located between the two support plates. Pixel spacers and edge seals that mechanically connect the first support plate with and opposite to the second overlying support plate, or which form a separation between the first support plate and the second support plate, can contribute to the mechanical integrity of the electrowetting display. Edge seals, for example, being disposed along a periphery of an array of electrowetting pixels, may contribute to retaining fluids (e.g., the first and second fluids) between the first support plate and the second support plate. Pixel spacers can be at least partially transparent so as to not hinder throughput of light in the electrowetting display. The transparency of pixel spacers may at least partially depend on the refractive index of the pixel spacer material, which can be similar to or the same as the refractive indices of surrounding media. Pixel spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
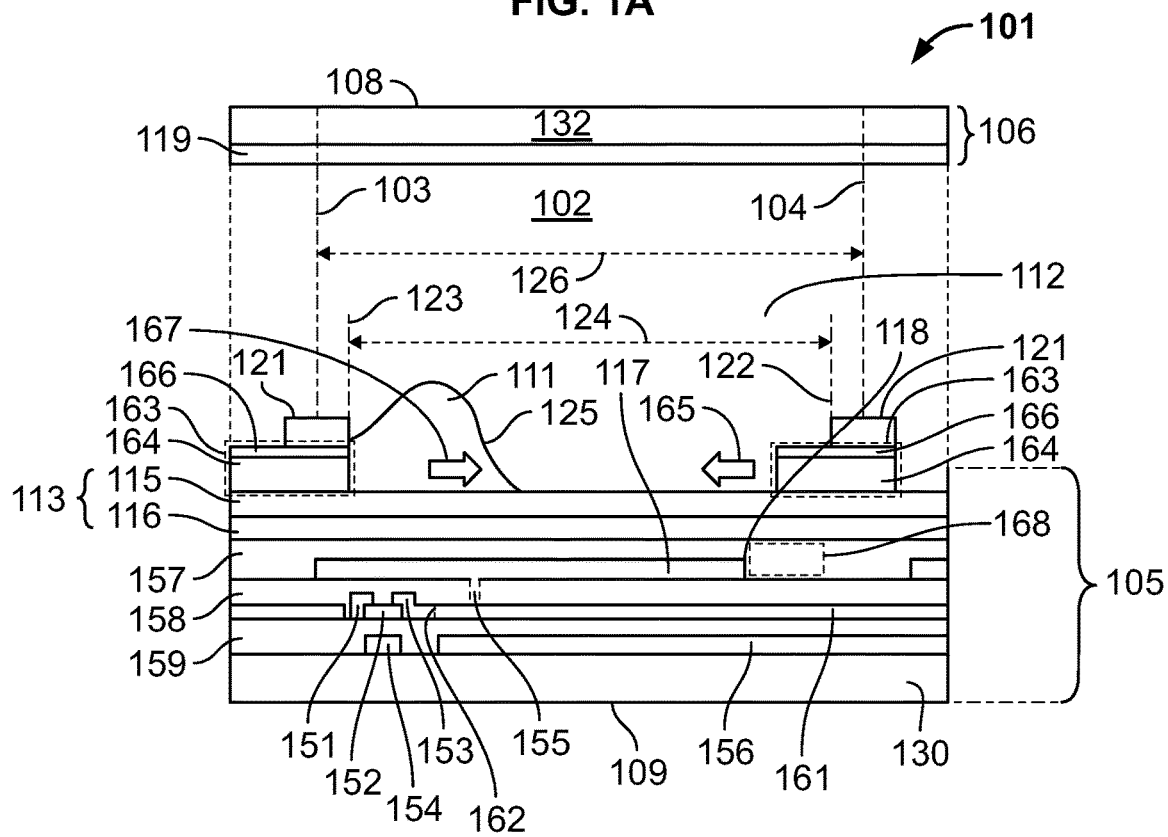

FIGS. 1A and 1B show diagrammatic cross-sectional views of part of an example of an electrowetting display device 101. FIG. 1A shows device 101 in which electrowetting pixel 102 is in a rest or off state, while FIG. 1B depicts electrowetting pixel 102 after the application of a driving voltage to pixel 102. Display device 101 may be of several types, including reflective, transmissive, or transflective types. Display device 101 may be an active matrix driven or a direct drive display device. Display device 101 includes a viewing side 108 upon which an image or display formed by the display device can be viewed as well as a rear side 109.

Electrowetting display device 101, includes a plurality of pixels, such as pixel 102, which may also be referred to as electrowetting display elements, picture elements, or electrowetting elements. In particular, pixel 102 is an example of an electrowetting display element that may produce a display effect. Pixel 102 may be monochrome or color. In some examples of a color display device, the pixels may be divided into groups, each group of pixels being associated with a different color, while in other examples, an individual pixel, such as pixel 102, may be able to produce different colors.

Pixel 102 comprises a first support plate 105 and a second support plate 106. First support plate 105 and second support plate 106 may be separate parts of each pixel, or the support plates may be shared in common by a plurality of pixels. First support plate 105 and second support plate 106 may include a glass or polymer substrate 130 and substrate 132, respectively, and may be rigid or flexible. First support plate 105 and second support plate 106 of pixel 102 may also include further aspects, such as wettable layer 115, barrier layer 116, pixel walls 121, circuitry for controlling the pixels (e.g., electrodes 117 and 119, signal lines (not shown), thin film transistors), and others aspects that are not depicted in FIGS. 1A and 1B for clarity.

In the example pixel 102, the extent of pixel 102 is indicated by the arrow 126 extending between dashed lines 103 and 104, which emanate from the center of pixel walls 121 of pixel 102. Further, in this example, the area of the surface between walls 121, indicated by arrow 124 extending between dashed lines 122 and 123, may be referred to as the display area 124, over which a display effect occurs. In examples, the display area may correspond with the surface area of the wettable layer, such as wettable layer 115, which is bounded by one or more walls, such as pixel walls 121, and which is adjoined by at least one of the first or second fluids, such as first fluid 111 and second fluid 112.

Pixel 102 includes a volume or space, which may otherwise be considered to be a chamber, between support plates 105 and 106, and which may be filled with a plurality of fluids. In the example of FIGS. 1A and 1B, the space is filled with first fluid 111 and second fluid 112.

First fluid 111 is electrically non-conductive. For example, first fluid 111 may include an alkane, like decane or hexadecane, a silicone oil, or decalin. First fluid 111 may also absorb at least a part of the visible light spectrum. For example, first fluid 111 may be translucent for a part of the visible light spectrum, thereby forming a color filter. In other embodiments, color filtering structures may be formed in pixel 102 to associated pixel 102 with a particular color. For example, color filters (not shown), may be formed over a surface of or within top support plate 106 to filter light passing therethrough.

First fluid 111 may also be colored by addition of pigment particles or a dye. In some examples, first fluid 111 may be black and may absorb substantially all parts of the visible light spectrum. In some examples, first fluid 111 may be reflective. For example, first fluid 111 may reflect the entire visible spectrum, making the fluid layer appear white, or may reflect only part of the visible light spectrum, making the fluid layer have a color. In some example, first fluid 111 may not absorb all wavelengths within a given spectrum, but may absorb the majority of wavelengths within the given spectrum. Thus, first fluid 111 may be configured to absorb substantially all light incident thereupon. In some examples, first fluid 111 may absorb 90% or more of light in the visible spectrum and incident thereupon.

First fluid 111 may be confined to pixel 102 by pixel walls 121, which follow the cross-section of pixel 102. The cross-section of a pixel may have any shape. When the pixels are arranged in a matrix form, the cross-section of each pixel may usually be square or rectangular. Pixel walls 121 are shown as structures formed or disposed on a surface of and protruding from wettable layer 115. In various examples, forming, disposing, or otherwise arranging an element of an electrowetting pixel may be accomplished through chemical vapor deposition (CVD), or one of its variants, such as plasma-enhanced chemical vapor deposition, or physical vapor deposition (PVD), and other processes known to those of skill in the art. Further, forming or disposing a second structure (e.g. a wall) on a first structure (e.g. a surface) may mean directly on (e.g., in contact with) or indirectly on, such as where there are one or more intervening structures (e.g., layers) and the second structure is above, overlying, or overlapping the first structure aspect through the intervening structures.

Alternatively, pixel walls 121 may instead be part of a surface layer of the support plate that repels the first fluid, such as a hydrophilic or less hydrophobic layer. As illustrated in FIGS. 1A and 1B, pixel walls 121 may extend only partly from first support plate 105 to second support plate 106. However, in other examples, walls may extend fully from first support plate 105 to second support plate 106.

Second fluid 112 is electrically conductive, polar, or both. For example, second fluid 112 may be water, or a salt solution, such as a solution of potassium chloride in water. In some examples, second fluid 112 may be translucent or colored. Examples of colored fluids may also be referred to as selective color absorbing fluids. First fluid 111 is substantially immiscible with second fluid 112, which is to say that first fluid 111 and second fluid 112 do not substantially mix with each other. In some examples, first fluid 111 and second fluid 112 do not mix with each other to any degree, while in other examples there may be some degree of mixing of first fluid 111 and second fluid 112. Even in such cases, the degree of mixing may be considered negligible in that the majority of the volume of first fluid 111 is not mixed with the majority of the volume of second fluid 112. The substantial immiscibility of first fluid 111 and second fluid 112 may be due to the properties of each fluids, such as, for example, their chemical compositions.

Due to the immiscibility of first fluid 111 with second fluid 112, first fluid 111 and second fluid 112 tend to remain separated from each other, therefore tending not to mix together to form a homogeneous mixture. Instead, first fluid 111 and second fluid 112 may meet each other at an interface, which may alternatively be referred to as a boundary or a meniscus. The depicted relative thickness of the first fluid 111 layer and the second fluid 112 layer are examples; in other examples, the first fluid 111 layer and the second fluid 112 layer (and potentially other fluid layers) may have different thicknesses.

Interface 125 of FIG. 1A exists when no voltage is applied to pixel 102. FIG. 1B depicts an example of an interface 125 that may exist when a driving voltage is applied to pixel 102. Interface 125 indicates a boundary between the volume of first fluid 111 and the volume of second fluid 112. The location and shape of the interface between first fluid 111 and second fluid 112 may be affected by the driving voltage applied to pixel 102 and may cause a display effect.

A display effect for pixel 102 may depend on both the extent that first fluid 111 and second fluid 112 adjoin the surface defined by the display area 124, and the magnitude of a voltage applied to pixel 102. In some examples, first fluid 111 may cover all or the majority of the display area 124 when no voltage is applied to the pixel 102, while in other examples, first fluid 111 may cover less than all or the majority of display area 124 when no voltage is applied to the pixel 102.

When there is no driving voltage being applied to pixel 102, first fluid 111 adheres preferentially to the surface of wettable layer 115 because the surface of wettable layer 115 has a greater wettability for first fluid 111 than for second fluid 112. When, instead, the applied driving voltage is a sufficient, non-zero driving voltage, as in FIG. 1B, the surface of wettable layer 115 has a greater wettability for second fluid 112 than for the first fluid 111. Thus, the driving voltage applied to pixel 102 may cause a display effect by altering the configuration of first fluid 111 and second fluid 112 within pixel 102. For example, line 125 of FIG. 1B depicts an alternative fluid arrangement of pixel 102 when pixel 102 is in an on state. In particular, first fluid 111 has been displaced against a pixel wall 121 by second fluid 112, which is more wettable to wettable layer 115 during the on state.

First support plate 105 includes insulating layer 113. Insulating layer 113 may be translucent, for example fully transparent or transmissive to visible light. Insulating layer 113 may extend between walls 121 of pixel 102. To avoid short circuits between second fluid 112 and electrode 117 under insulating layer 113, insulating layer 113 may extend uninterrupted over a plurality of pixels.

Insulating layer 113 may include a wettable layer 115. Wettability relates to the relative affinity of a fluid for the surface of a solid. Wettability may be measured by the contact angle between a boundary of the fluid and the surface of the solid. The contact angle is determined by the difference in surface tension between the fluid and the solid at the fluid-solid boundary. For example, a high difference in surface tension can indicate hydrophobic properties. As the skilled person will appreciate, a material may be considered to be hydrophobic if the contact angle with water is greater than 90 degrees; a material may therefore be considered to be hydrophilic if the contact angle with water is less than 90 degrees.

In some examples, a wettable layer may be a hydrophobic layer, for example, formed of a hydrophobic material, such as Teflon AF1600®. In some examples, a hydrophobic layer comprises more than 80%, more than 90%, more than 95%, approximately 100% or 100% of a hydrophobic material by weight or by volume. The remainder of the hydrophobic layer may, for example, be formed of a different material than a hydrophobic material.

Pixel 102 includes electrode 117 as part of the support plate 105. In this example, there is one electrode 117 per pixel. In other examples, there may be more than one electrode as part of support plate 105. Electrode 117 may be of any desired shape or form. In some examples, electrode 117 also acts as a reflective surface, such as in the case of a reflective type pixel. In such examples, electrode 117 may be formed of a reflective and conductive material, such as a metallic material. In some examples, electrode 117 is formed of aluminum. In some examples, electrode 117 is separated from barrier layer 116 by an insulating layer 157. Insulating layer 157 may be a layer comprising a dielectric material, which is a very poor conductor of electric current.

Electrode 117 does not extend across the full length of pixel 102 and instead defines a notch region 168 that does not include any electrode 117 material. Notch region 168 generally extends from an end 118 of electrode 117 towards pixel wall 121.

Insulated notch structure 163 is formed over insulating layer 113 and notch region 168. Generally, insulated notch structure 163 is formed over a portion of display area 124 that does not include electrode 117. Within pixel 102, insulated notch structure 163 generally extends underneath pixel wall 121 from a portion located vertically over an end 118, with pixel walls 121 being formed over insulated notch structure 163. Insulated notch structure 163 is generally formed from two layers of material, though other configurations of insulated notch structure 163 may be implemented. In one example, insulated notch structure 163 may be formed by a first insulating layer 164 formed upon insulating layer 113. Insulating layer 164 may include any suitable insulating material such as indium nitride. Layer 166 is formed over insulating layer 164. Layer 166 may include a polymer layer (e.g., fluoropolymer) to seal and provide protection to insulated notch structure 163.

The location of the end 118 of electrode 117 under insulated notch structure 163 results in the electric field at that end 118 of electrode 117 being stronger due to the fringe field effect. As is known, with the fringe field effect, if one has two parallel plates forming a capacitor, the electric field does not end abruptly at the edge of the plates. There is some field outside the plates that curves from one plate to the other plate. This can increase the apparent electric field at the end of the plates. As such, the voltage drop within pixel 102 is greater at the end 118 of electrode 117 at insulated notch structure 163. Consequently, in response to a driving voltage applied to pixel 102, the greater fringe electric field effect can cause first fluid 111 to break away from pixel wall 121 in the direction of arrow 165 away from insulated notch structure 163.

Electrode 117 of pixel 102 is supplied with voltage signals by a signal line (not shown). Electrode 117 is electrically insulated from first fluid 111 and second fluid 112 by insulating layer 113. In some examples, electrodes of neighboring pixels may be separated by a non-conducting layer, while in other examples, electrodes of neighboring pixels may be electrically connected. In some examples, further layers may be arranged between insulating layer 113 and electrode 117.

Second support plate 106 includes electrode 119, which is connected to second signal line (not shown), and which extends between walls of pixel 102. In some examples, electrode 119 may be disposed or formed, for example located, above and/or covering, overlying, or overlapping the walls of pixel 102 and/or extend uninterruptedly over a plurality of pixels. Alternatively, electrode 119 may be arranged at a border of second support plate 106, where it is in electrical contact with second fluid 112. Electrode 119 is common to all pixels 102 in device 101. Electrode 117 and electrode 119 may be made of, for example, a translucent conductive material, such as indium tin oxide (ITO).

A switching element is used to control the driving voltage applied to electrode 117, and in-turn for controlling application of a voltage between electrode 117 and electrode 119 of pixel 102. In this example, the switching element is a transistor such as a thin film transistor (TFT), which is located in first support plate 105. The TFT includes a source terminal 151, a drain terminal 153, which is electrically connected to electrode 117, a semiconducting channel 152 connecting source terminal 151 to drain terminal 153, and a gate terminal 154.

In various embodiments, terminals, such as the gate, source and drain terminals, may be electrically conductive structures, such as a node, trace, or other type of connection in an electronic circuit. While the figures depict various example terminals with specific shapes and arrangements, those of skill in the art will appreciate that such terminals may have other shapes and arrangement as the case may be, and may include complex geometries.

One or more of gate terminal 154, source terminal 151, and drain terminal 153 may comprise materials such as molybdenum, aluminum, titanium, copper, or other conductive materials as are known by those of skill in the art, such as other metals and metal alloys. Further, in this example, gate terminal 154 is separated from semiconducting channel 152 by an insulating layer 159, which may comprise a dielectric material thereby electrically insulating gate terminal 154 from semiconducting channel 152. Further, source terminal 151, semiconducting channel 152, and drain terminal 153 may be separated from electrode 117 by an insulating layer 158, which may comprise a dielectric material.

Semiconducting channel 152 is formed from a doped semiconducting material, such as, for example, Silicon (Si), Silicon Germanium (SiGe), Germanium (Ge), Indium Arsenide (InAs), and the like or any combination thereof. The semiconducting channel 152 is doped to be either an n-type or p-type region. During operation, and without any control voltage being applied to gate terminal 154 of the transistor, the semiconducting channel 152 includes a depleted region that does not contain any charge carriers. As such, semiconducting channel 152 operates as an insulator and does not transmit electricity. As such, source terminal 151 and drain terminal 153 are electrically isolated from one another.

When, however, a control voltage is applied to gate terminal 154, charge carriers are attracted into the depleted region of semiconducting channel 152. This allows semiconducting channel 152 to conduct electricity, electrically connecting source terminal 151 and drain terminal 153.

In this manner, gate terminal 154 acts as a control terminal the determines whether semiconducting channel 152 is electrically conductive and whether a charge applied to source terminal 151 will be conducted through semiconducting channel 152 and drain terminal 153.

As described above, in some examples, electrode 117 may be made of a translucent conductive material such as ITO. In examples where electrode 117 is made of a translucent material, there may be a separate layer with a reflective surface, such as a reflector, which may be used to reflect light back out of the pixel (e.g., in the case of reflective or transreflective display types). In other examples, electrode 117 may be made of a reflective conductive material instead, such as a metallic material or a metallic alloy material. In such examples, electrode 117 may act as a reflector in addition to an electrode.

Drain terminal 153 is electrically connected to electrode 117 via contact hole 155 (referred to herein also as a second contact hole), which may be, for example, a via, or other electrical interconnect as are known by persons of skill in the art. Contact hole 155 may be formed through insulating layer 158 by, for example, physical or chemical etching, and other methods as are known by those of skill in the art. Once formed, contact hole 155 may have a conductive material, such as a metallic material, deposited on its inner surface in order to electrically connect drain terminal 153 with electrode 117.

Source terminal 151 may be supplied with a voltage by a source signal line (not shown). Gate terminal 154 is supplied with a voltage by a gate signal line (not shown). As is known to the skilled person, a voltage may be applied to electrode 117 by applying a suitable electric potential or control voltage to gate terminal 154, which thereafter changes a state of the semiconducting channel 152 from an electrically non-conducting state to an electrically conducting state. Thus, the transistor may be switched to an electrically conducting state so that the voltage applied to source terminal 151 may be conducted via semiconducting channel 152 to electrode 117 via drain terminal 153. In other words, a flow of electric current between source terminal 151 and drain terminal 153, via semiconducting channel 152, is controllable by application of a control voltage to gate terminal 154.

In examples of active matrix pixels, source terminal 151 may be connected by a source signal line (not shown) to a column driver (not shown) and gate terminal 154 may be connected by a gate signal line (not shown) to a row driver (not shown) in order to control the magnitude of and when an electric potential is applied to electrode 117 thereby further controlling a configuration of first fluid 111 and second fluid 112.

Gate terminal 154 can be formed as a layer of electrically conductive metal on substrate 130 of first support plate 105. Thereafter, an insulating layer 159 comprising a dielectric material, such as silicon nitride or silicon dioxide, is formed on gate terminal 154.

Semiconducting channel 152 is formed as a layer of semiconducting material on insulating layer 159 such that semiconducting channel 152 at least partly overlaps gate terminal 154. In some examples, semiconducting channel 152 may be formed of a semiconducting material such as that used to form electrode 117 and drain terminal 153, while source terminal 151 and gate terminal 154 may for example be formed from other materials, such as molybdenum (Mo), an alloy including molybdenum (Mo) and chromium (Cr), or aluminum (Al).

Source terminal 151 and drain terminal 153 are formed from electrically conductive material. Source terminal 151 and drain terminal 153 do not contact each other, but instead are connected to each other by semiconducting channel 152, between drain terminal 153 and source terminal 151. Thereafter, insulating layer 158 is formed, for example by depositing a dielectric material, over source terminal 151, gate terminal 154, and drain terminal 153.

Electrode 117 is formed on insulating layer 158. Thereafter, insulating layer 157 is formed upon which a barrier layer 116 is formed.

First support plate 105 includes a first capacitor plate 156, which may form a storage capacitor with second capacitor plate 161. In some cases, drain terminal 153 and second capacitor plate 161 may be electrically connected, such as at a connection point or a boundary 162, or otherwise drain terminal 153 and second capacitor plate 161 may be integrally formed. First capacitor plate 156 is separated from second capacitor plate 161 by insulating layer 159. In this example, the storage capacitor is connected in parallel with the capacitor formed by electrode 117 and electrode 119. Consequently, a voltage may be applied between electrode 117 and electrode 119 for longer after switching the transistor off by removing the electric potential from gate terminal 154. First capacitor plate 156 may be formed of, for example, molybdenum (Mo), an alloy including molybdenum (Mo) and chromium (Cr), or aluminum (Al). In other examples, first capacitor plate 156 may not be present.

Figure 2:
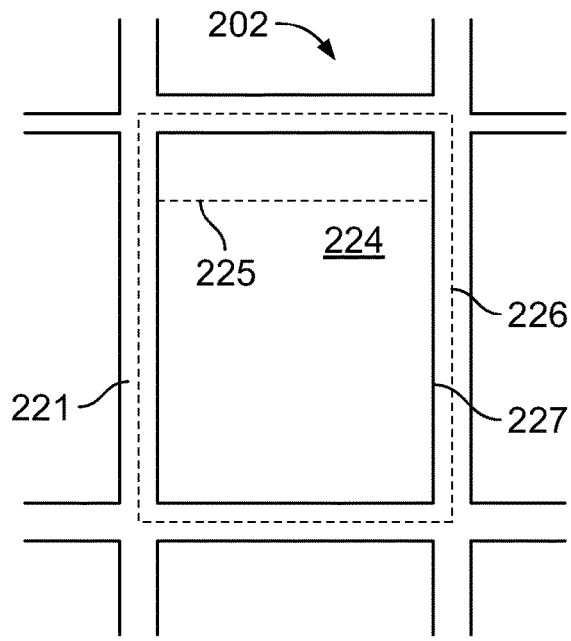
FIG. 2 illustrates a top view of the electrowetting pixels of FIGS. 1A and 1B.

FIG. 2 depicts part of a matrix of rectangular pixels in a plan view. For example, pixel 202 may be pixel 102 of FIGS. 1A and 1B depicted in a plan view. In the example pixel 202 depicted in FIG. 2, the outer boundary of pixel 202 is indicated by dashed line 226, which corresponds to dashed lines 103 and 104 in FIGS. 1A and 1B. Solid line 227 indicates the inner border of a wall 221 and is also the edge of display area 224 of pixel 202. In this example, display area 224 is a hydrophobic surface of first support plate 105. Note that in other examples, the walls 221 of pixel 202 may be formed into different shapes, for example, not square or rectangular. Further, in other examples, the display area 224 similarly be formed into different shapes, for example, not square or rectangular.

As described above, when a zero or substantially zero voltage is applied between electrode 117 and electrode 119 (shown in FIG. 1A), i.e., when the electrowetting pixel is in an off state, first fluid 111 forms a layer extending between the walls 121. When a non-zero voltage is applied between electrode 117 and electrode 119 (shown in FIG. 1B), i.e., when the electrowetting pixel is in an on state, second fluid 112 will displace first fluid 111 such that first fluid 111 will retract (or contract) against a wall, as shown by the dashed shape 225 in FIG. 2 (and 125 in FIG. 1B). Accordingly, the controllable displacement of first fluid 111 in dependence on the magnitude of the applied voltage is used to operate the pixel as a light valve and to provide a display effect over display area 224. For example, displacing first fluid 111 to increase adjoinment of second fluid 112 with display area 224 may increase the brightness of the display effect provided by pixel 102. The display state of pixel 102 may therefore go from black to white, or to any intermediate grey state in a black and white display device; or from black to a color of varying brightness in a color display device.

When supplying the driving voltage of pixel 102 of FIGS. 1A and 1B, however, a control voltage must first be applied to gate terminal 154. That control voltage will, at least to some degree, attract second fluid 112, potentially causing second fluid 112 to enter pixel 102 over gate terminal 154 displacing first fluid 111 in the direction of arrow 167 (see FIG. 1B). This can reduce the effectiveness of insulated notch structure 163 in controlling the direction of first fluid 111 movement when pixel 102 is first subjected to a driving voltage after being in an off state. This reduces the overall predictability in the movement of first fluid 111 in response to a driving voltage reducing the precision with which the brightness of the display effect of pixel 102 can be controlled.

To reduce the degree to which the control voltage being applied to gate terminal 154 interferes with the predictable movement of first fluid 111, insulated notch structure 163 may be relocated within pixel 102 to be positioned at least partially over gate terminal 154 or at least towards the same end of pixel 102 as gate terminal 154. In that configuration, the forces exerted on first fluid 111 as a result of gate terminal 154 being set to a control voltage and the fringe field effect in electrode 117 at insulated notch structure 163 will both tend to promote movement of first fluid 111 in the same direction and will not act in opposition to one another.

Figure 3A:
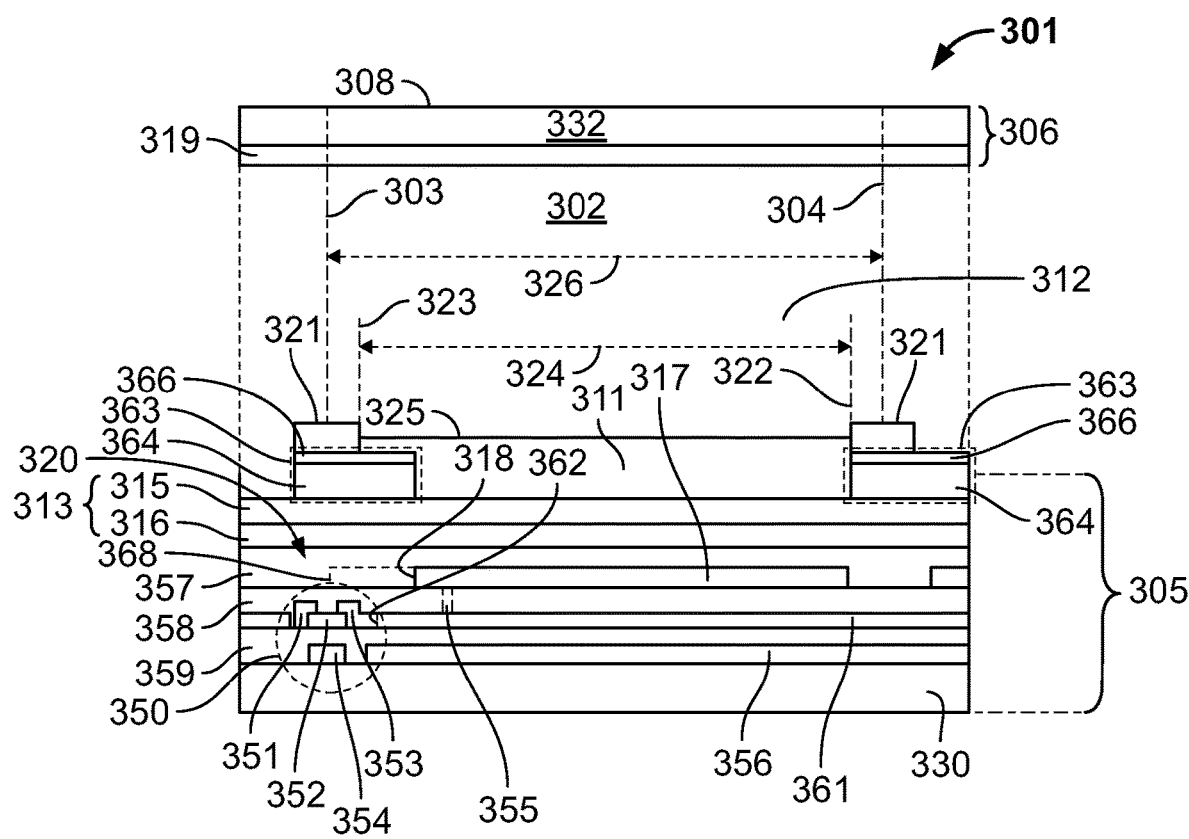
FIGS. 3A and 3B illustrate cross sectional views of an electrowetting display device in which a pixel electrode defines a notch region formed over the pixel's transistor and an insulted notch structure is over the notch region.
Figure 3B:
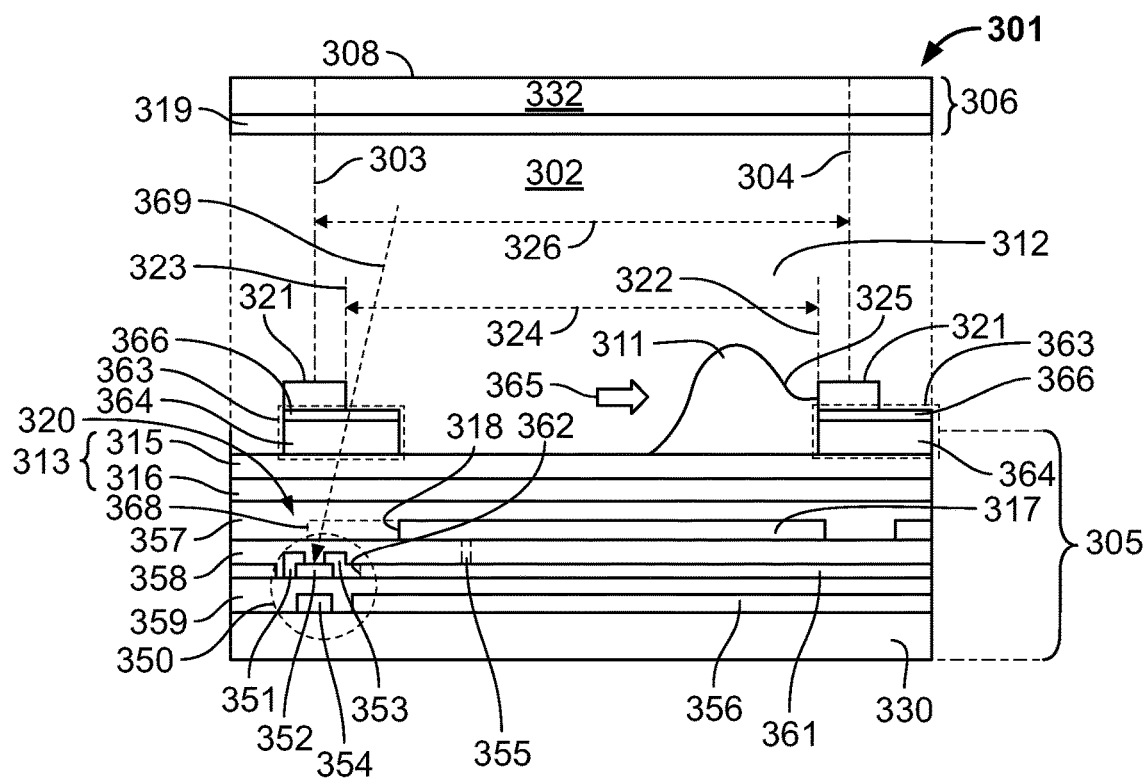

FIGS. 3A and 3B show diagrammatic cross-sectional views of part of an example of an electrowetting display device 301 according to the present disclosure. FIG. 3A shows device 301 in which electrowetting pixel 302 is in a rest or off state, while FIG. 3B depicts electrowetting pixel 302 after the application of a driving voltage.

Pixel 302 comprises a first support plate 305 and a second support plate 306. First support plate 305 includes substrate 330 and second support plate includes substrate 332. First support plate 305 and second support plate 306 of pixel 302 may also include further aspects, such as: wettable layer 315, barrier layer 316, walls 321, circuitry for controlling the pixels (e.g., electrodes 317 and 319, signal lines (not shown)), and others aspects that are not depicted for clarity.

The extent of pixel 302 is indicated by the arrow 326 extending between dashed lines 303 and 304, which emanate from the center of walls 321 of pixel 302. Further, in this example, the area of the surface between walls 321, indicated by arrow 324 extending between dashed lines 322 and 323, may be referred to as the display area 324, over which a display effect occurs.

Pixel 302 includes a space or volume between support plates 305 and 305, and which may be filled with a plurality of fluids. The space is filled with first fluid 311 and second fluid 312. First fluid 311 is electrically non-conductive and may be at least partially opaque. Color filtering structures may be formed in pixel 302 to associate pixel 302 with a particular color. For example, color filters (not shown), may be formed over a surface of top support plate 306 to filter light passing therethrough. First fluid 311 may also be colored by addition of pigment particles or a dye.

Second fluid 312 is electrically conductive, polar, or both. For example, second fluid 312 may be water, or a salt solution, such as a solution of potassium chloride in water. In some examples, second fluid 312 may be translucent or colored. Examples of colored fluids may also be referred to as selective color absorbing fluids. First fluid 311 is substantially immiscible with second fluid 312.

FIG. 3A depicts an example of an interface 325 between first fluid 311 and second fluid 312 that may exist when no voltage is applied to pixel 302. FIG. 3B depicts an example of an interface 325 that may exist when a driving voltage is applied to pixel 302.

When there is no driving voltage being applied to pixel 302, first fluid 311 adheres preferentially to the surface of wettable layer 315. When, instead, the applied voltage is a sufficient, non-zero driving voltage, as in FIG. 3B, the surface of wettable layer 315 has a greater wettability for second fluid 312 than for the first fluid 311. Thus, the driving voltage applied to pixel 302 may cause a display effect by altering the configuration of first fluid 311 and second fluid 312 within pixel 302.

Pixel 302 includes electrode 317 as part of the support plate 305. Electrode 317 also acts as a reflective surface, such as in the case of a reflective type pixel. In such examples, electrode 317 may be formed of a reflective and conductive material, such as a metallic material. Electrode 317 is separated from barrier layer 316 by an insulating layer 357. Insulating layer 357 may be a layer comprising a dielectric material.

Electrode 317 does not extend across the full length of pixel 302 and instead defines a notch region 368 that does not include any electrode 317 material. Notch region 368 of electrode 317 generally extends from an end 318 of electrode 317 towards pixel wall 321. Specifically, notch region 368 extends horizontally from end 318 of electrode 317 towards a location 320 directly underneath pixel wall 321, as depicted in FIGS. 3A and 3B.

Figure 3C:
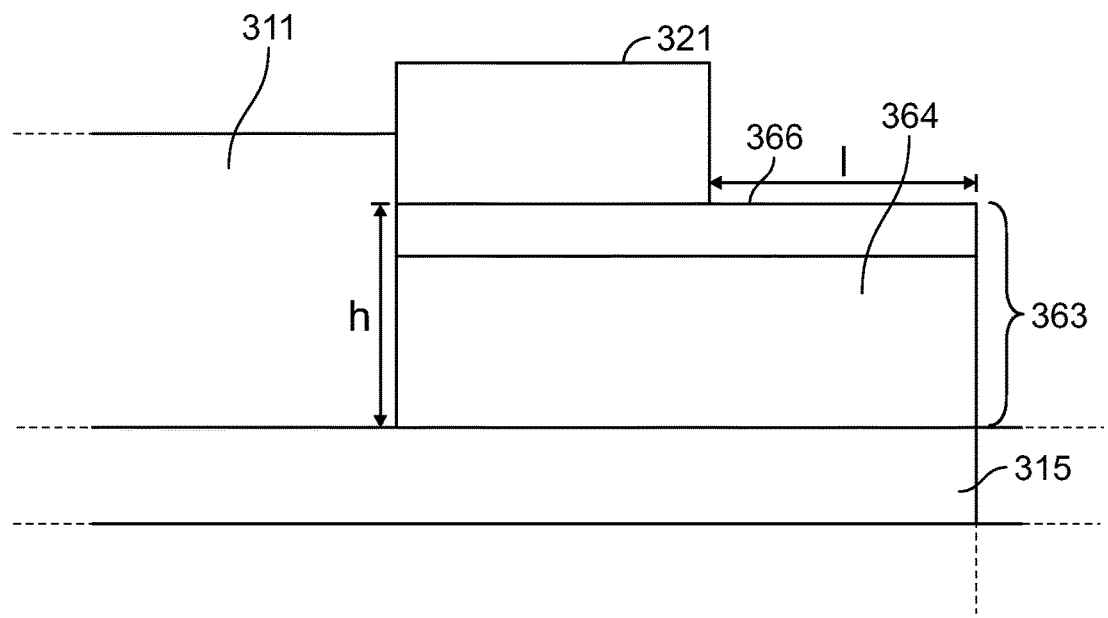
FIG. 3C is an enlarged view showing detail of the insulated notch structure depicted in FIGS. 3A and 3B.

Insulated notch structure 363 is formed over insulating layer 313. FIG. 3C is an enlarged view showing additional detail of insulated notch structure 363.

Generally insulated notch structure 363 is formed over a portion of display area 324 that does not include electrode 317. Within pixel 302, insulated notch structure 363 generally extends from a portion located vertically over an end 318 of electrode 317 underneath pixel wall 321, with pixel walls 321 being formed over insulated notch structure 363. Accordingly, electrode 317 is patterned within pixel 302 to define a notch region 368 of electrode 317 that extends from end 318 of electrode 317 towards location 320 underneath pixel wall 321. Notch region 368 of electrode 317 does not include any electrode material. In embodiments, insulated notch structure 363 is shaped to overlap the notch region 368 of electrode 317 without overlapping electrode 317 itself.

Insulated notch structure 363 is generally formed from two layers of material, though other configurations of insulated notch structure 363 may be implemented. In one example, insulated notch structure 363 may be formed by a first insulating layer 364 formed upon insulating layer 313. Insulating layer 364 may include any suitable insulating or dielectric material such as indium nitride. Layer 366 is formed over insulating layer 364. Layer 366 may include a polymer layer (e.g., fluoropolymer) to seal and provide protection to insulated notch structure 363.

The dimension of insulated notch structure 363 may at least partially be determined by the overall implementation of pixel 302. In various embodiments, however, the height (h) of insulated notch structure 363 (measured from the top of layer 315 to the top of layer 366 is equal to or greater than a width of pixel walls 321. In one embodiment, the height varies from 8 micrometers to 13 micrometers, or greater. Insulated notch structure 363 can extend into pixel 302 by a distance (1) measured from the edge of pixel wall 321 into pixel 302. In one embodiment, the distance 1 is in the range of the width of pixel wall 321 to twice the width of pixel wall 321. Accordingly, in some embodiments, the distance 1 ranges from 8 micrometers to 13 micrometers or greater. In some embodiment, for example, where insulated notch structure 363 is located on a narrow side of pixel 302, the distance 1 may be approximately 2 micrometers.

Thus, electrode 317 extends from a first portion of insulating layer 357 to a second portion of insulating layer 357 such that the second portion of insulating layer 357 is an electrode-free portion underneath insulated notch structure 363. In this configuration, electrode 317 is only located underneath a first portion of display area 324. A second portion of display area 324 is located over insulated notch structure 363 and so is not located over electrode 317. As shown in FIGS. 3A and 3B, insulated notch structure 363 is at least partially located over transistor 350 that includes semiconducting channel 352. Insulated notch structure 363 is considered to be located over transistor 350 that includes semiconducting channel 352 when insulated notch structure 363 overlaps transistor 350 when viewed from above (i.e., in a direction the looks through device 301 from viewing side 308).

The location of the end 318 of electrode 317 at the edge of insulated notch structure 363 results in the electric field at that end of electrode 317 being stronger than in the remainder of electrode 317 due to the fringe field effect. As such, the voltage drop within pixel 302 is greater at the end 318 of electrode 317 at insulated notch structure 363 than throughout the remainder of electrode 317. Consequently, in response to a driving voltage applied to pixel 302, the greater fringe electric field effect can cause first fluid 311 to break away pixel wall 321 in the direction of arrow 365. Electrode 317 of pixel 302 is supplied with voltage signals by a signal line (not shown). Electrode 317 is electrically insulated from first fluid 311 and second fluid 312 by insulating layer 313.

Second support plate 306 includes electrode 319, which is connected to second signal line (not shown), and which extends between walls of pixel 302. Electrode 317 and electrode 319 may be made of, for example, a translucent conductive material, such as ITO.

A switching element or switch is used to control the voltage applied to electrode 317, and in-turn for controlling application of a voltage between electrode 317 and electrode 319 of pixel 302. In this example, the switching element is a transistor such as a TFT 350, which is located in first support plate 305. In various embodiments, the location of transistor 350 may be modified from that depicted in FIGS. 3A and 3B. For example, transistor 350 may be formed so that transistor 350, or at least a portion of transistor 350, is located directly underneath or directly below at least a portion of one or more of pixel walls 321.

Figure 3D:
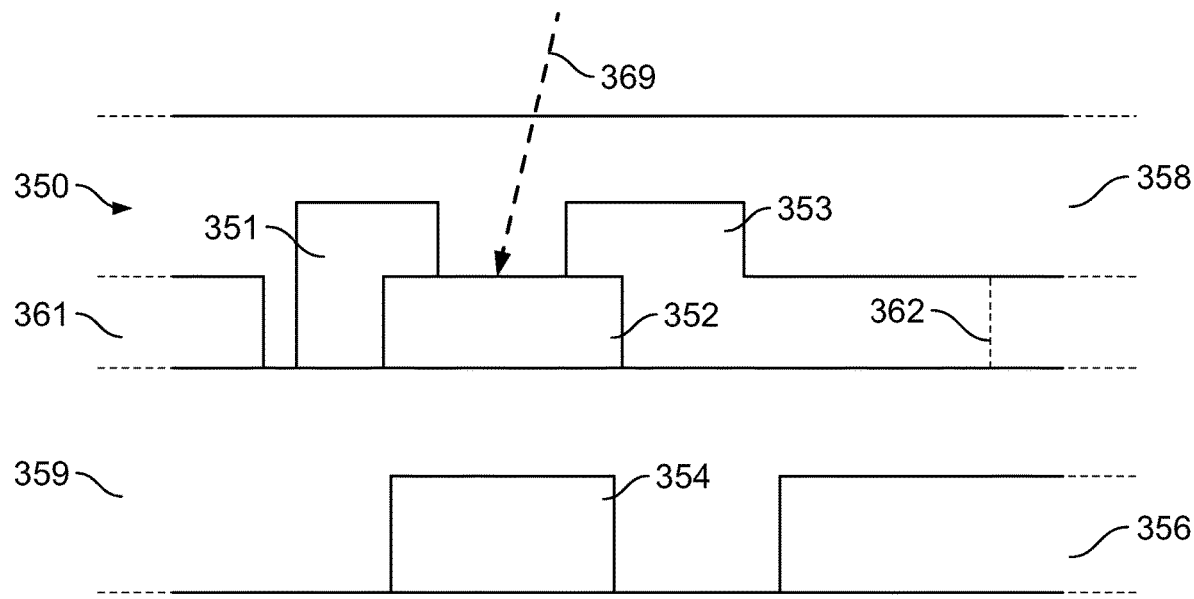
FIG. 3D is an enlarged view showing detail of the transistor of FIGS. 3A and 3B.

FIG. 3D is an enlarged view showing detail of transistor 350. Transistor 350 includes a source terminal 351, a drain terminal 353, which is electrically connected to electrode 317, a semiconducting channel 352 connecting source terminal 351 to drain terminal 353, and a gate terminal 354. Semiconducting channel 352 is in contact with source terminal 351 and drain terminal 353.

Gate terminal 354 is separated from semiconducting channel 352 by an insulating layer 359, which may comprise a dielectric material thereby electrically insulating gate terminal 354 from semiconducting channel 352. Further, source terminal 351, semiconducting channel 352, and drain terminal 353 may be separated from electrode 317 by an insulating layer 358, which may comprise a dielectric material.

Drain terminal 353 is electrically connected to electrode 317 via contact hole 355 (referred to herein also as a second contact hole), which may be, for example, a via, or other electrical interconnect as are known by persons of skill in the art. Contact hole 355 may be formed through insulating layer 358 by, for example, physical or chemical etching, and other methods as are known by those of skill in the art. Once formed, contact hole 355 may have a conductive material, such as a metallic material, deposited on its inner surface in order to electrically connect drain terminal 353 with electrode 317.

A driving voltage may be applied to electrode 317 by applying a suitable electric potential or control voltage to gate terminal 354, which thereafter changes a state of the semiconducting channel 352 from an electrically non-conducting state to an electrically conducting state. Thus, the transistor may be switched to an electrically conducting state so that the voltage applied to source terminal 351 may be conducted via semiconducting channel 352 to electrode 317 via drain terminal 353. In other words, a flow of electric current between source terminal 351 and drain terminal 353, via semiconducting channel 352, is controllable by application of a control voltage to gate terminal 354.

First support plate 305 includes first capacitor plate 356, which may form a storage capacitor with second capacitor plate 361. Drain terminal 353 and second capacitor plate 361 may be electrically connected, such as at a connection point or a boundary 362, or otherwise drain terminal 353 and second capacitor plate 361 may be integrally formed. First capacitor plate 356 is separated from second capacitor plate 361 by insulating layer 359. The storage capacitor is connected in parallel with the capacitor formed by electrode 317 and electrode 319. Consequently, a voltage may be applied between electrode 317 and electrode 319 for longer after switching the transistor off by removing the electric potential from gate terminal 354.

When a zero or substantially zero voltage is applied between electrode 317 and electrode 319 (shown in FIG. 3A), i.e., when the electrowetting pixel is in an off state, first fluid 311 forms a layer extending between the walls 321. When a non-zero voltage is applied between electrode 317 and electrode 319 (shown in FIG. 3B), i.e., when the electrowetting pixel is in an on state, second fluid 312 will displace first fluid 311 such that first fluid 311 will retract (or contract) against a wall, as shown by the dashed shape 325 in FIG. 3B. Accordingly, the controllable displacement of first fluid 311 in dependence on the magnitude of the applied voltage is used to operate the pixel as a light valve and to provide a display effect over display area 324. For example, displacing first fluid 311 to increase adjoinment of second fluid 312 with display area 324 may increase the brightness of the display effect provided by pixel 302. The display state of pixel 302 may therefore go from black to white, or to any intermediate grey state in a black and white display device; or from black to a color of varying brightness in a color display device.

When supplying the driving voltage of pixel 302 of FIGS. 3A and 3B, a control voltage is first applied to gate terminal 354. That control voltage will, at least to some degree, attract second fluid 312, potentially causing second fluid 312 to enter pixel 302 over gate terminal 354 displacing first fluid 311. This can promote a movement of first fluid 311 in the direction of arrow 365.

Accordingly, in this arrangement, both insulated notch structure 363 and the control voltage being applied to gate terminal 354 promote displacement of first fluid 311 in the same direction (see arrow 365) in response to the application of a driving voltage of pixel 302. As these forces are working to promote movement of first fluid 311 in the same direction, the predictability of the direction of first fluid 311 movement in response to a driving voltage may be increased over conventional pixel configurations.

Figure 4:
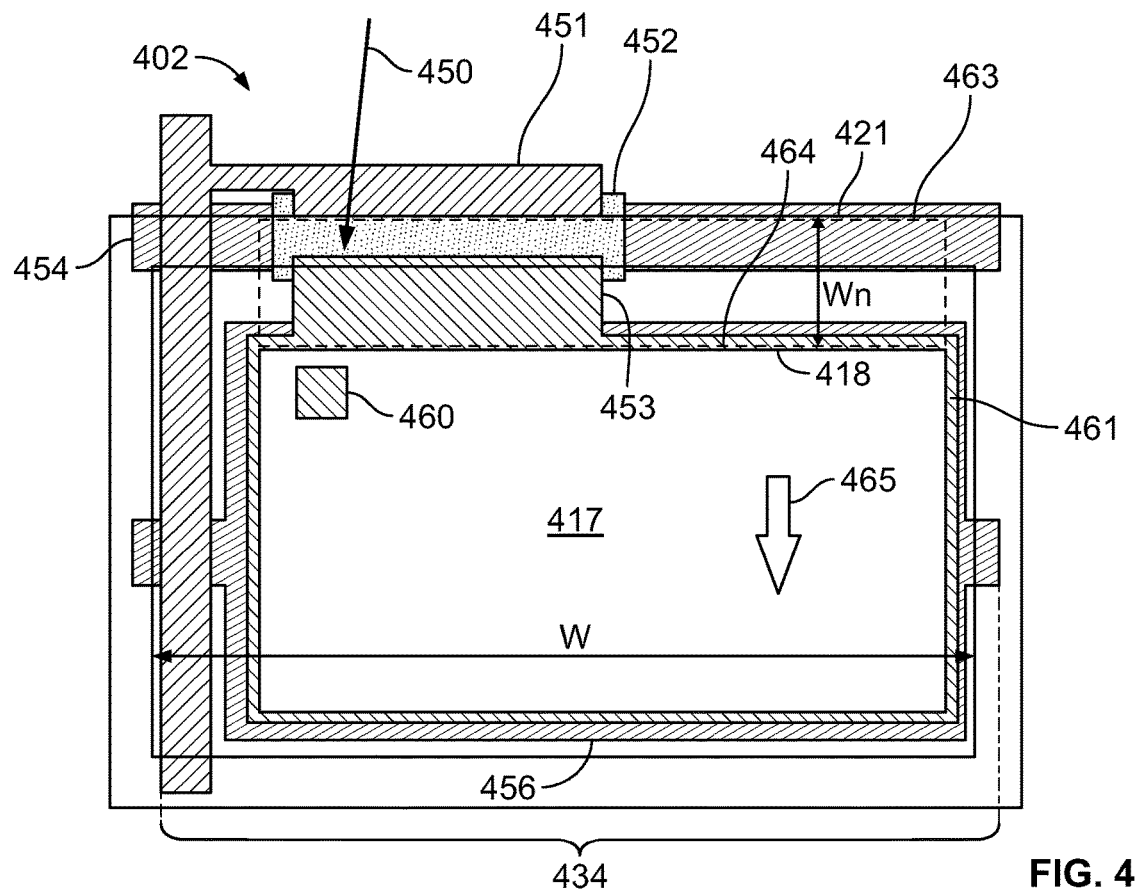
FIGS. 4 and 5 depict plan views of electrowetting pixels, wherein each pixel include an insulated notch structure formed over the pixel's transistor.

FIG. 4 depicts a plan or top view of aspects of a pixel 402. Pixel 402 may be of a similar configuration to pixel 302 depicted in FIGS. 3A and 3B. In particular, FIG. 4 depicts control circuitry of pixel 402, including a thin film transistor (TFT) 434. TFT 434 includes a gate terminal 454; a first capacitor plate 456; a semiconducting channel 452 that is formed over a gate terminal 454; a source terminal 451 and a drain terminal 453 that are formed above gate terminal 454 and over portions of semiconducting channel 452; a second capacitor plate 461, which is integrally formed with drain terminal 453; and a contact hole 460 which connects drain terminal 453 to electrode 417. Pixel 402 also includes pixel walls 421, which in this example are made of a translucent material. Note that intervening layers, such as a barrier layer and a wettable layer (described above) are not shown in FIG. 4 for clarity.

FIG. 4 also depicts insulated notch structure 463. In the figure, insulated notch structure 463 is depicted transparently so that structure underlying can be seen. As described above, insulated notch structure 463 may include multiple layers of material, including a first layer of insulating layer and a sealing layer formed over the insulating layer. In an embodiment, electrode 417 is patterned within pixel 402 to define a notch region (i.e., a region that does not include any electrode 417 material) so that insulated notch structure 463 does not overlap any portion of electrode 417. In the embodiment of FIG. 4, edge 418 of electrode 417 defines the notch region and is located directly under edge 464 of insulated notch structure 463. Accordingly insulated notch structure 463 is located over the notch region of electrode 417 and, specifically, a region of pixel 102 that does not contain any electrode material. As in FIGS. 3A and 3B, insulated notch structure 463 operates in combination with edge 418 of electrode 417 to promote movement of a first fluid (e.g., an opaque oil) within pixel 402 in direction 465 in response to electrode 417 being subjected to a driving voltage.

Figure 5:
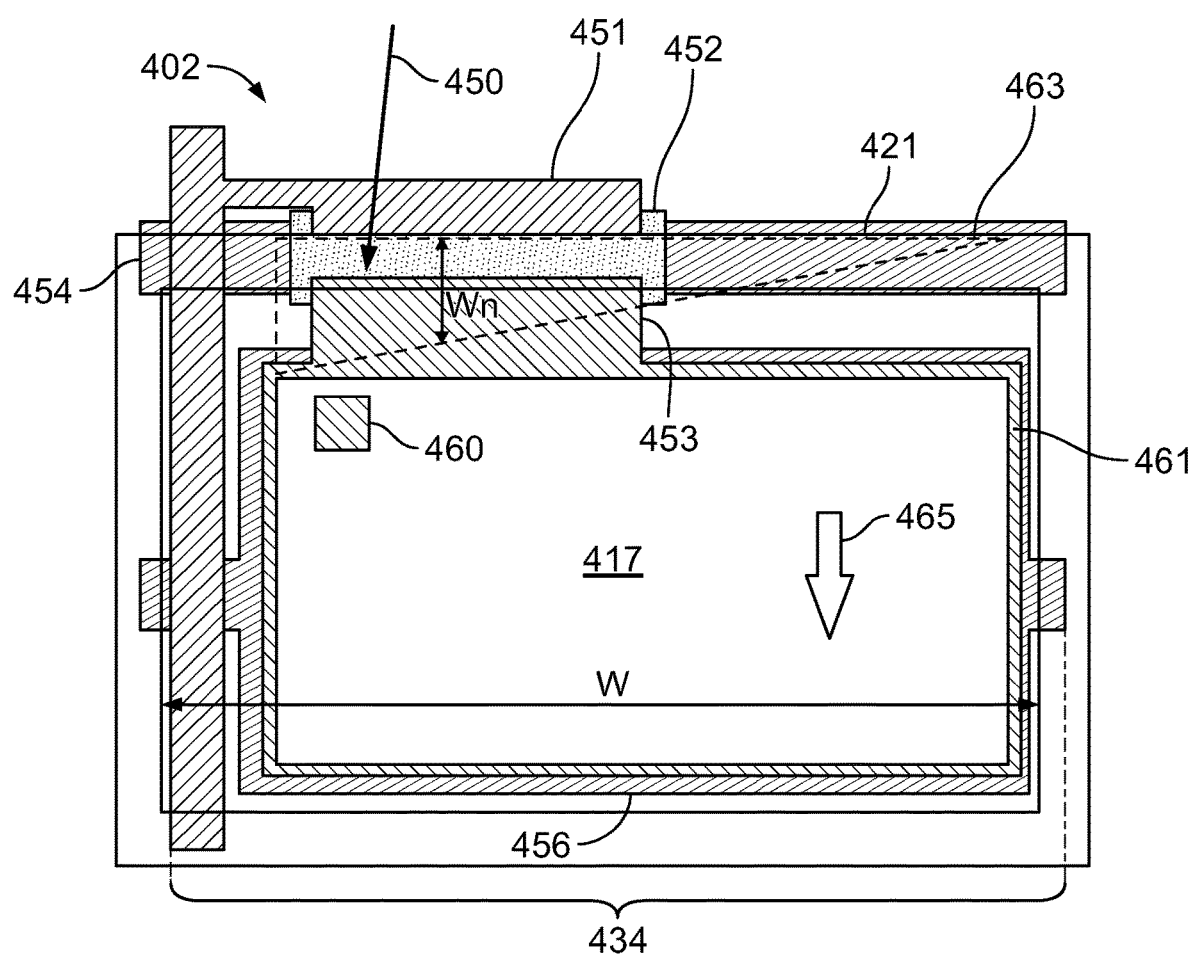

In various embodiments, insulated notch structure 463 may have any suitable shape configured to promote fluid movement in a particular direction within pixel 402. In FIG. 4, insulated notch structure 463 is generally rectangular so that the width of insulated notch structure 463 (wn) does not vary across the width w of pixel 402. In other embodiments, however, the width wn of insulated notch structure 463 does vary. FIG. 5, for example, depicts pixel 402 in which the width (wn) of insulated notch structure 463 varies across the width w of pixel 402. In some cases, the non-symmetrical structure of insulated notch structure 463 can provide improved control over oil motion, such as by making the initiation of oil movement within the pixel more effective in response to a particular driving voltage.

In these various configurations of insulated notch structure 463 (see FIGS. 4 and 5), however, at least a portion of transistor 434 is not covered by electrode 417. And, specifically, at least a portion of insulated notch structure 463 is located over semiconducting channel 452 of transistor 434. As such, incident light 450 can pass through the translucent layers of pixel 402 (see also incident light 369 on FIGS. 3B and 3D and strike the semiconducting channel 452 of transistor 434. As described above, such incident light 450 may cause the generation of a photocurrent in semiconducting channel 452 that negatively affects other aspects of the control circuitry for pixel 402 as well as control circuitry in adjacent pixels.

To protect semiconducting channel 452 from incident light, a light shield could be formed over transistor 434. Such a light shield may operate by reflecting, absorbing, diverting, or otherwise preventing light from reaching underlying circuitry, such as semiconducting channel 452. In some examples, the light shield could be made of a reflective metal material in order to reflect incident light away from underlying circuitry, such as semiconducting channel 452. However, a metallic light shield may lead to undesirable capacitive coupling between, for example, source terminal 451 and/or drain terminal 453 and such a light shield. The capacitive coupling may undesirably increase power consumption of pixel 402 and may further cause a kick-back effect in the display unit, where kick-back is caused by, with transistor 434 switched off, a parasitic capacitance effect discharging the capacitor formed between the second fluid and the electrode, which can undesirably change the display effect by changing the configuration of the first and second fluids.

To mitigate some of these effects, a light shield may be formed over transistor 434, where the light shield is electrically connected to gate terminal 454 to form a second gate terminal of transistor 434.

Figure 6:
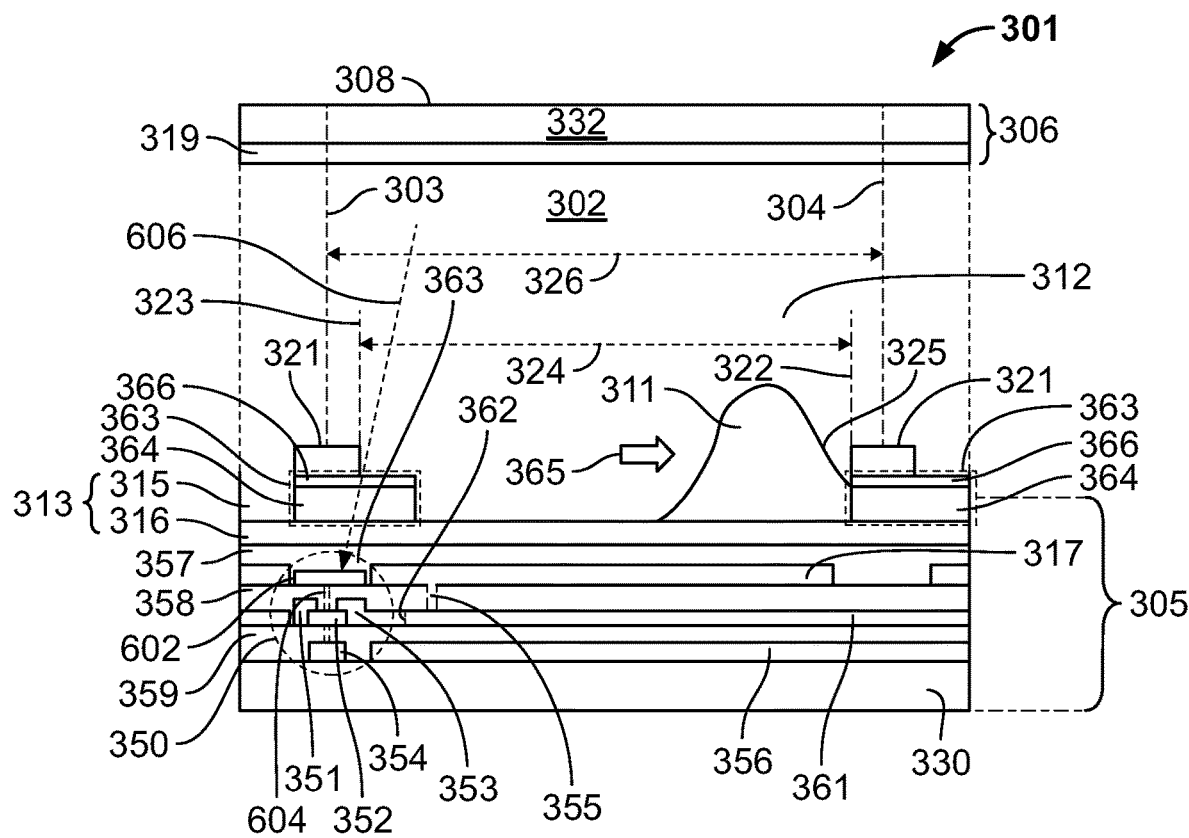
FIG. 6 is a cross sectional view of an electrowetting display device in which a pixel electrode defines a notch region over the pixel's transistor and the transistor includes a second gate terminal.

FIG. 6 depicts display device 301 of FIGS. 3A and 3B including insulated notch structure 363 over semiconducting channel 352. In addition, a second gate terminal 602 is formed on insulating layer 358 over gate terminal 354. Second gate terminal 602 can be made of a conductive material, such as a metal. Gate terminal 602 may be further electrically connected to first gate terminal 354 by way of, for example, a contact hole 604 through insulating layer 358. In various implementations gate terminal 354 may be formed by patterning the same material that makes up electrode 317. Alternatively, second gate terminal 602 may be formed over insulating layer 358 as part of a separate fabrication step in which second gate terminal 602 is deposited for patterned separately from electrode 317.

In this configuration, any voltage applied to first gate terminal 354 will cause that same voltage to also be applied to second gate terminal 602, which may beneficially increase the current flow across semiconducting channel 352. Additionally, by increasing the effective size of the transistor's gate terminal (by combining the effective sizes of gate terminal 354 and second gate terminal 602), the effective turn-on resistance (Ron) of the transistor is reduced, which, in turn, reduces the power consumption of the transistor.

As illustrated by light 606, second gate terminal 602 blocks or reflects at least some of the ambient light that may otherwise pass through insulated notch structure 363 and notch region 368 defined by electrode 317 and strike semiconducting channel 452 and so can minimize the creation of unwarranted photocurrent that may otherwise be generated within semiconducting channel. As such, gate terminal 602 can operate as a light shield to prevent stray light from striking semiconducting channel 452. When constructed as a metal, rather than absorb the stray light, gate terminal 602 operates as a reflective material to reflect that stray light.

Figure 7:
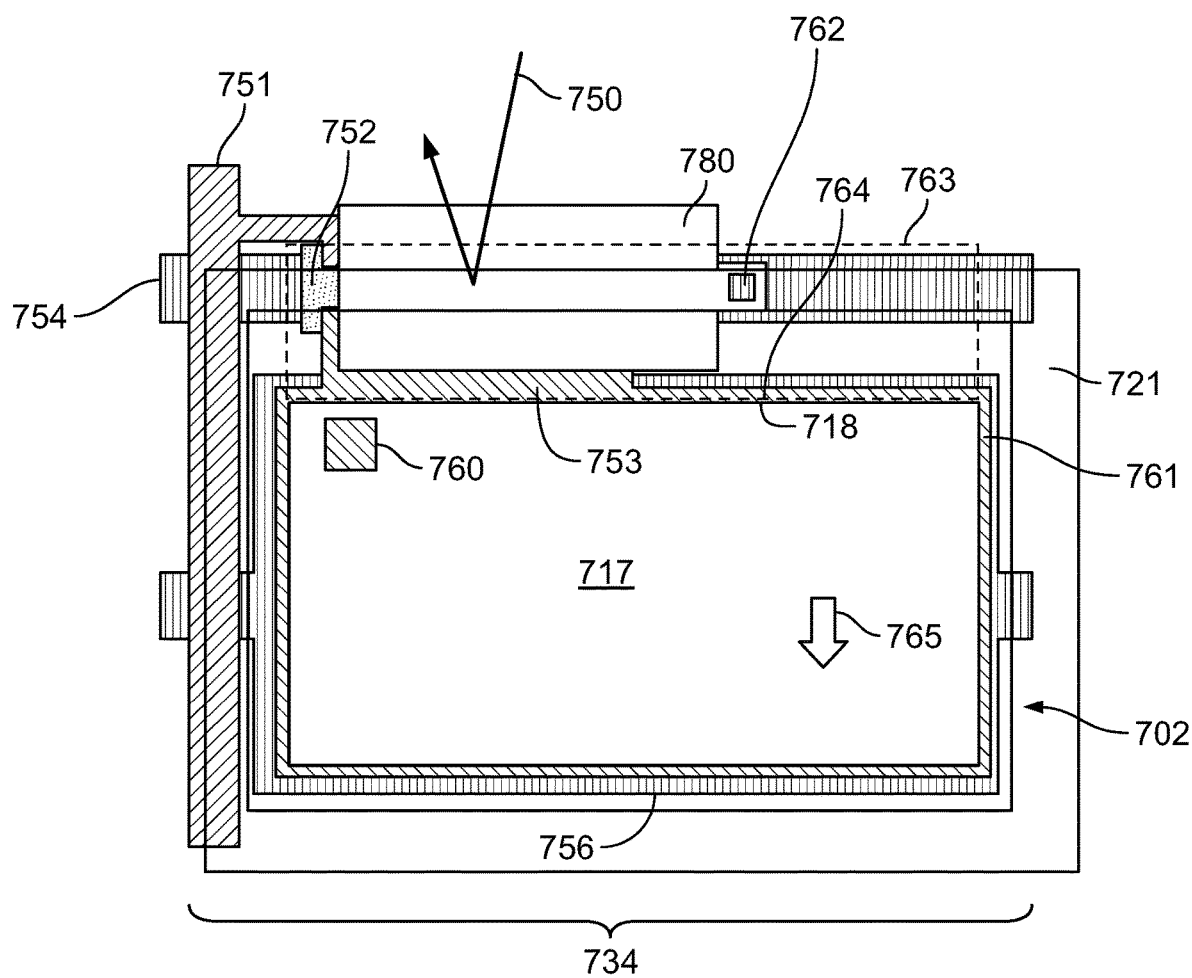
FIG. 7 depicts a plan view of an electrowetting pixel including a pixel transistor having a second gate terminal.

FIG. 7 depicts a plan view of aspects of a pixel 702. Pixel 702 may be of similar configuration to pixel 302 as depicted in FIG. 6. As in FIG. 6, pixel 702 includes transistor 734. An insulated notch structure 763 is formed over transistor 734. Transistor 734 includes a first gate terminal 754 located to apply a first gate voltage; a semiconducting channel 752 that is formed over a portion of first gate terminal 754; a source terminal 751 and a drain terminal 753 that are formed above first gate terminal 754 and semiconducting channel 752; a second capacitor plate 761, which is integrally formed with drain terminal 753; and a contact hole 760 which connects drain terminal 753 to electrode 717. Pixel 702 also includes a wall 721. Note that intervening layers, such as the barrier layer and wettable layer, as well as other aspects of pixel 702, such as those described above, are not shown in FIG. 7.

FIG. 7 also depicts insulated notch structure 763. In the figure, insulated notch structure 763 is depicted transparently so that underlying structure can be seen. As described above, insulated notch structure 763 may include multiple layers of material, including a first layer of insulating layer and a sealing layer formed over the insulating layer. In an embodiment, electrode 717 is patterned to define a notch region (i.e., a region that does not include any electrode 717 material) so that insulated notch structure 763 does not overlap any portion of electrode 717. In the embodiment of FIG. 7, edge 718 of electrode 717 is located directly under edge 764 of insulated notch structure 763. Accordingly insulated notch structure 763 is located over a region of pixel 702 that does not contain any electrode 717 material. As in FIG. 6, insulated notch structure 763 operates in combination with edge 718 of electrode 717 to promote movement of a first fluid (e.g., an opaque oil) within pixel 702 in direction 765 in response to electrode 717 being subjected to a driving voltage. In other embodiments, however, insulated notch structure 763 may have any suitable shape configured to promote fluid movement in a particular direction within pixel 702.

Pixel 702 includes a second gate terminal 780 located to apply a second gate voltage, which also acts as a light shield for semiconducting channel 752. In this example, second gate terminal 780 is a metal layer that is both conductive and reflective of light. In some examples, second gate terminal 880 may be formed of the same material as electrode 717, while in others it may be formed of a different material.

In FIG. 7, at least a portion, i.e. a part, of second gate terminal 780 is overlapping a portion of the semiconducting channel 752. The term overlap may in examples be considered to indicate one element at least partly covering a different element, so in this example the portion of second gate terminal 780 covers, for example overlies, the portion of semiconducting channel 752. In examples, there may be at least one layer or material, for example an insulating layer, or a void, between the overlapping elements.

By positioning second gate terminal 780 above semiconducting channel 752, incident light that passes through insulated notch structure 763 and would otherwise enter semiconducting channel 752 is reduced, which also reduces the undesirable photo current effects described above. For example, incident light 750 impacts second gate terminal 780 and can then be reflected away from pixel 702 instead of entering semiconducting channel 752.

Second gate terminal 780 may be formed with different widths and lengths. For example, the width of second gate terminal 780 may be equal to or less than the width of the semiconducting channel 752 between source terminal 751 and drain terminal 753 of transistor 734 in order to reduce capacitive coupling between second gate terminal 780 and source terminal 751 and drain terminal 753, which should in-turn reduce the power consumption of transistor 734. Alternatively, the width of second gate terminal 780 may be equal to or greater than the width of the semiconducting channel 752 between source terminal 751 and drain terminal 753 of transistor 734 in order reduce to a minimum an amount of light striking semiconducting channel 752.

Second gate terminal 780 is connected by way of contact hole 762 (referred to herein also as first contact hole) to the underlying first gate terminal 754.

Figure 8A:
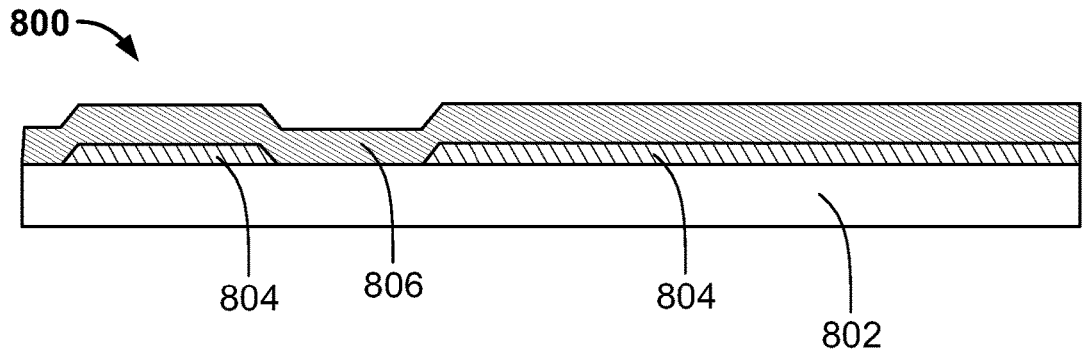
FIGS. 8A-8E are cross-sectional views depicting a method of fabricating a pixel of an electrowetting display device.

FIGS. 8A-8E are cross-sectional views depicting a method for fabricating a portion of a pixel structure 800 incorporating the present insulated notch structure. In FIG. 8A, a substrate 802 is provided. Substrate 802 may include glass or any of a number of at least partially transparent materials, such as transparent plastic, quartz, and semiconductors, for example, and claimed subject matter is not limited in this respect. Metal layer 804 is patterned over substrate 802. Metal layer 804 will form, at least in part, a portion of a first gate terminal of the transistor of pixel structure 800. Insulating layer 806 is formed over metal layer 804. Insulating layer 806 can include any suitable electrically insulative material, such as silicon nitride (SiN).

Figure 8B:
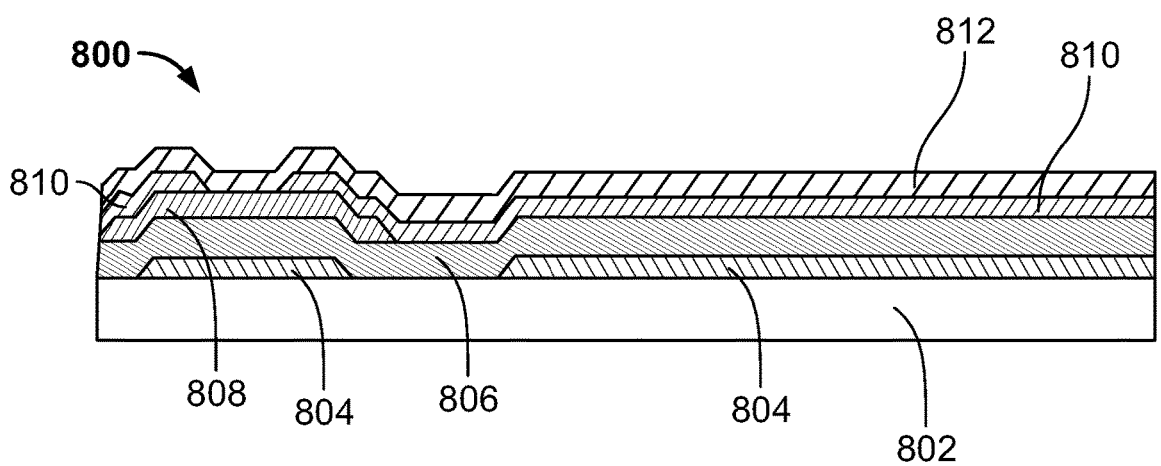

Turning to FIG. 8B, semiconducting channel 808 is deposited over insulating layer 806. Semiconducting channel 808 includes a doped semiconducting material, such as Si, SiGe, InAs, or Ge, for example, and may be formed using suitable photolithographic of deposition techniques. Over semiconducting channel 808, metal layer 810 is patterned. Metal layer 810 includes two portion, with portion 810a ultimately making up the source contact of the transistor of pixel structure 800, while portion 810b makes up the drain contact of the transistor of pixel structure 800. Another insulating layer 812 (e.g., SiN) is formed over metal layer 810.

Figure 8C:
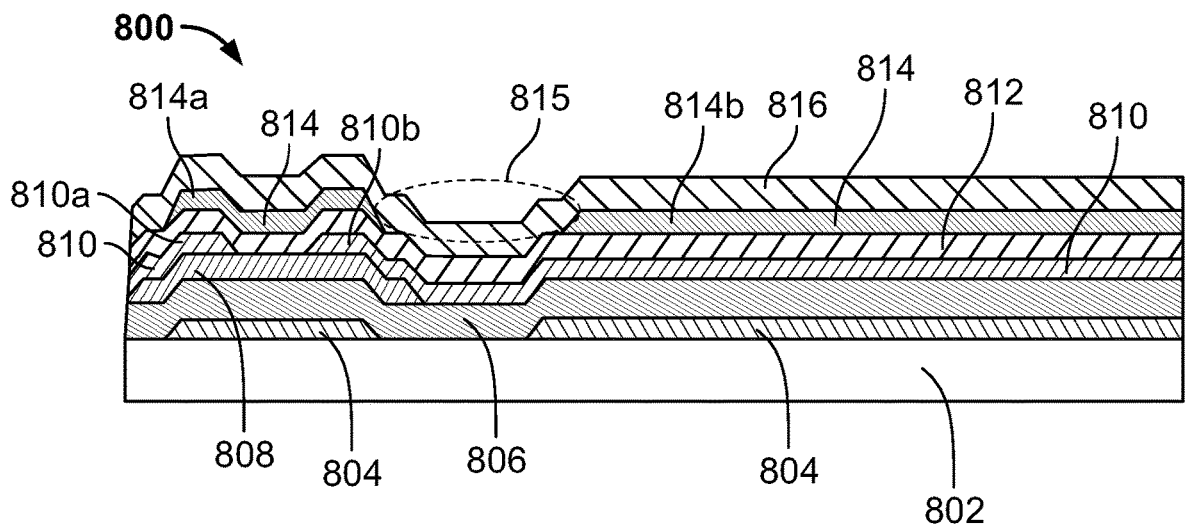

Turning to FIG. 8C, metal layer 814 is patterned over insulating layer 812. Metal layer 814 may include any electrically conductive material. Portion 814a of metal layer 814 ultimately forms a top gate terminal of the transistor of pixel structure 800. Portion 814b of metal layer 814 may ultimately form the electrode or reflector of pixel structure 800. Portions 814a and 814b of metal layer 814 may be deposited and patterned at substantially the same time, or may be formed separately in different fabrication steps. Portion 814b is pattern to define a notch region 815 for the electrode.

Barrier layer 816 is deposited over metal layer 814. Barrier layer 816 may be formed by any suitable deposition process and generally includes a dielectric material.

Figure 8D:
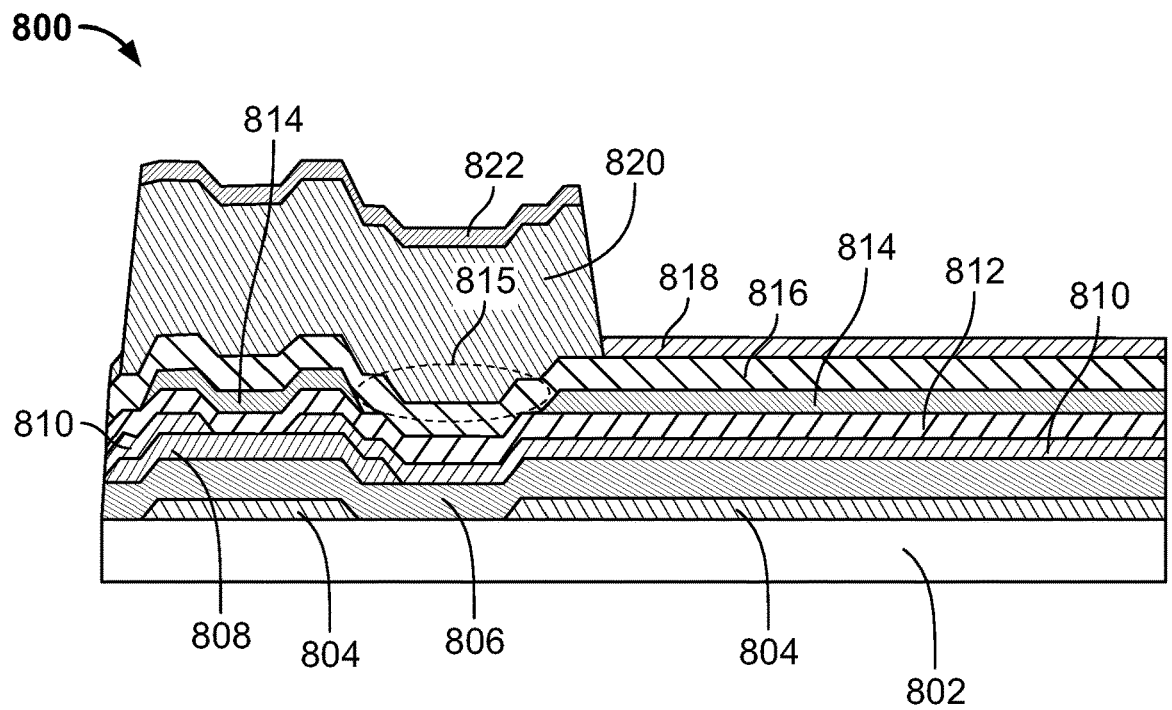

Turning to FIG. 8D, a wettable layer 818, which may include indium nitride, is formed over pixel structure 800. Additionally, a layer 820 of electrically insulating material, such as indium nitride, which makes up a portion of the insulated notch of pixel structure 800, is formed over barrier layer 816. Finally, a polymer layer 822, which may include fluoropolymer or other suitable materials, is formed over layer 820 to complete the formation of the insulated notch. Layer 822 may seal and provide protection to the structure of the insulated notch.

Figure 8E:
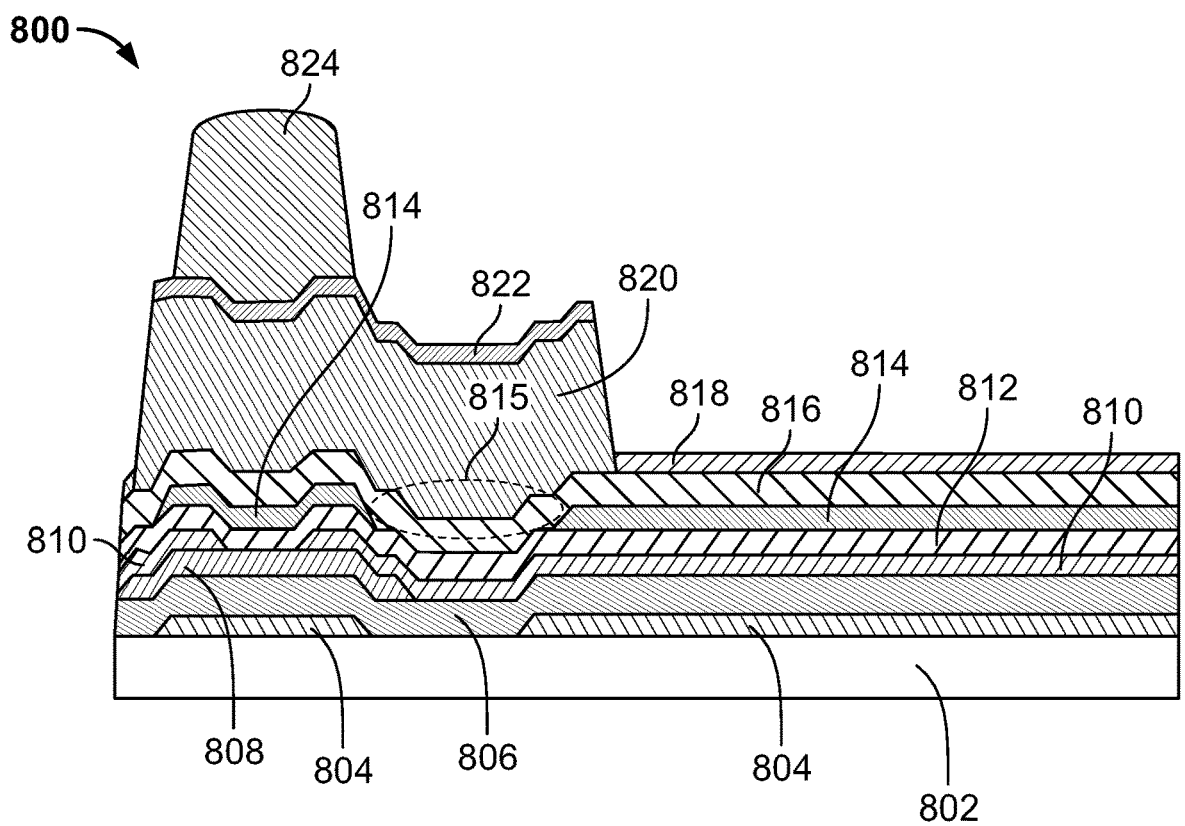

Finally, as depicted in FIG. 8E, pixel walls 824 are deposited over the insulated notch and, specifically, over layer 822. Pixel walls 824 may be formed using photolithographic techniques in which photo-sensitive materials are utilized to build-up pixel walls 824 by a process of material deposit and etching away. Pixel walls 824 may include any suitable materials, such as a transparent thermoplastic such as PMMA or other polymer materials.

Figure 9:
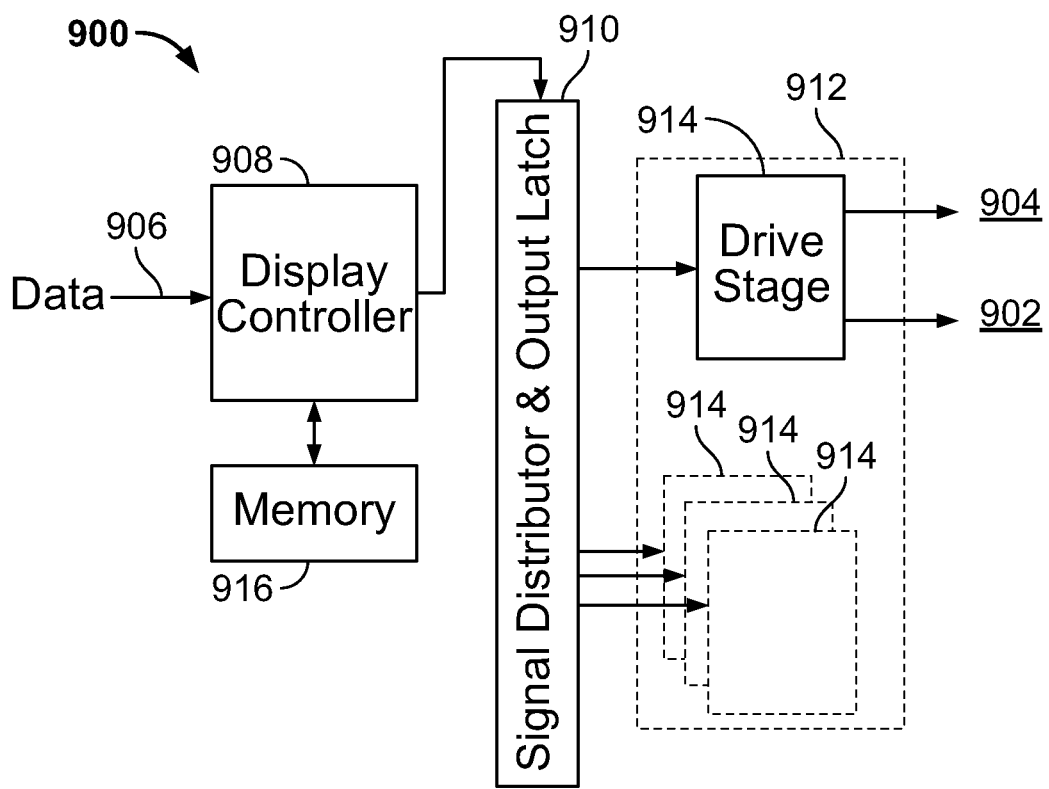
FIG. 9 is a block diagram of an example embodiment of an electrowetting display driving system, including a control system of the electrowetting display device.

FIG. 9 shows a block diagram of an example embodiment of an electrowetting display driving system 900, including a control system of a display device, such as display device 301 of FIGS. 3A and 3B. Display driving system 900 can be of the so-called direct drive type and may be in the form of an integrated circuit adhered or otherwise connected to a support plate of the display device, such as support plate 330 of FIG. 3A. Display driving system 900 includes control logic and switching logic, and is connected to the display by means of electrode signal lines 902 and a common signal line 904. Each electrode signal line 902 connects an output from display driving system 900 to a different electrode within each pixel (e.g., pixel 302) in the display device, respectively. Also included are one or more input data lines 906, whereby display driving system 900 can be instructed with data so as to determine which pixels 302 should be in an active or open state and which pixels 302 should be in an inactive or closed state at any moment of time. In this manner, display driving system 900 can determine a target reflectance value for each pixel 302 within the display.

Electrowetting display driving system 900 as shown in FIG. 9 includes a display controller 908, e.g., a microcontroller, receiving input data from input data lines 906 relating to the image to be displayed. Display controller 908, being in this embodiment the control system, is configured to apply a voltage to the first electrode to establish a particular display state (i.e., reflectance value) for a pixel 302. The microcontroller controls a timing and/or a signal level of at least one pixel 302.

The output of display controller 908 is connected to the data input of a signal distributor and data output latch 910. Signal distributor and data output latch 910 distributes incoming data over a plurality of outputs connected to the display device, via drivers in certain embodiments. Signal distributor and data output latch 910 cause data input indicating that a certain pixel 302 is to be set in a specific display state to be sent to the output connected to pixel 302.

Signal distributor and data output latch 910 may be a shift register. The input data is clocked into the shift register and at receipt of a latch pulse the content of the shift register is copied to signal distributor and data output latch 910. Signal distributor and data output latch 910 has one or more outputs, connected to a driver assembly 912. The outputs of signal distributor and data output latch 910 are connected to the inputs of one or more driver stages 914 within electrowetting display driving system 900. The outputs of each driver stage 914 are connected through electrode signal lines 902 and common signal line 904 to a corresponding pixel 302. In response to the input data, a driver stage 914 will output a voltage of the signal level set by display controller 908 to set one of pixels 302 to a corresponding display state having a target reflectance level.

To assist in setting a particular pixel to a target reflectance level, memory 916 may also store data that maps a particular driving voltage for a pixel to a corresponding reflectance value and vice versa. The data may be stored as one or more curves depicting the relationship between driving voltage and reflectance value, or a number of discrete data points that map a driving voltage to a reflectance value and vice versa. As such, when display controller 908 identifies a target reflectance value for a particular pixel, display controller 908 can use the data mapping driving voltage to reflectance value to identify a corresponding driving voltage. The pixel can then be driven with that driving voltage.

Figure 10:
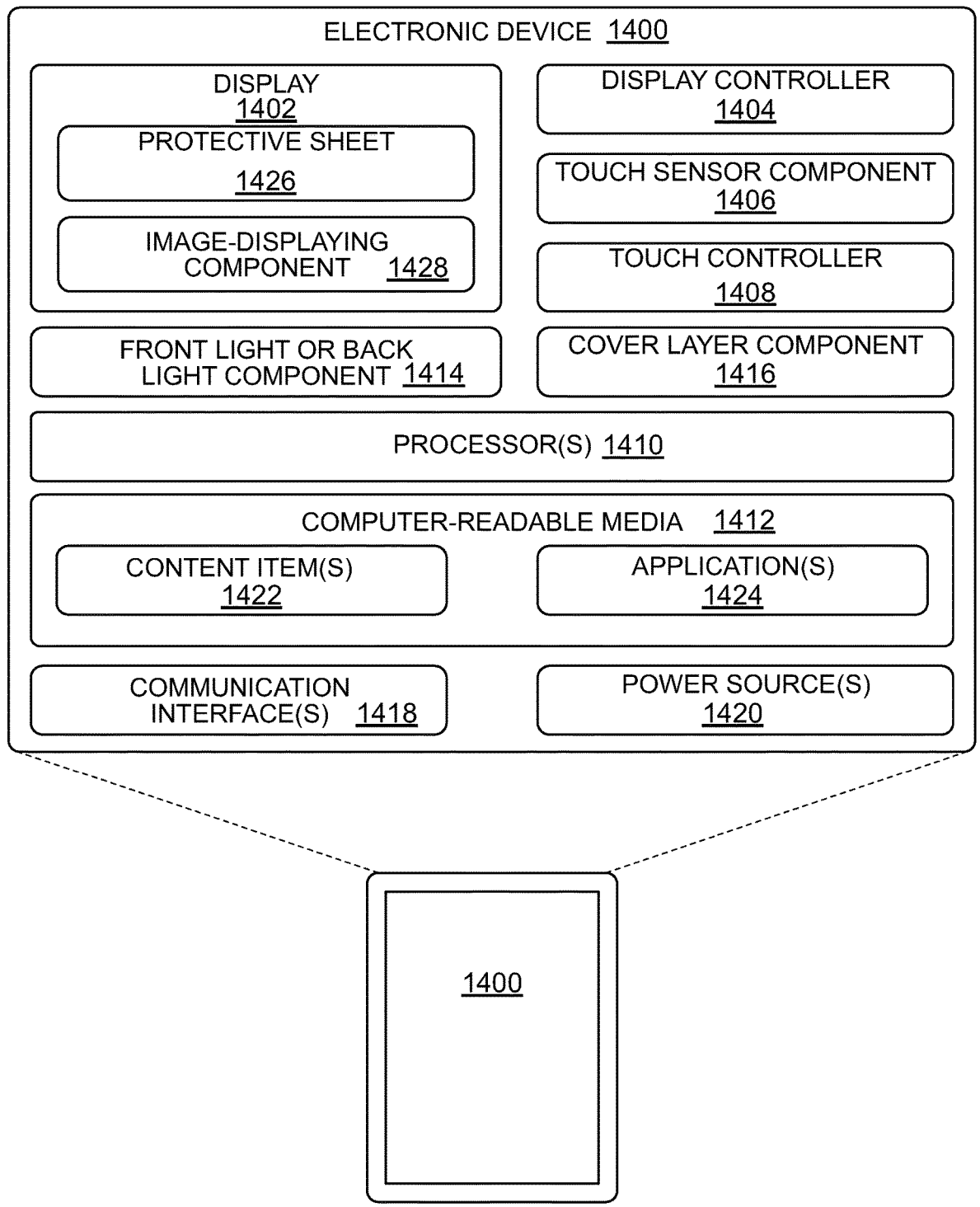
FIG. 10 illustrates an example electronic device that may incorporate a display device, according to various embodiments.

FIG. 10 illustrates an example electronic device 1400 that may incorporate any of the display devices discussed above. Electronic device 1400 may comprise any type of electronic device having a display. For instance, electronic device 1400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400 may be a non-mobile electronic device (e.g., a computer display or a television). In addition, while FIG. 10 illustrates several example components of electronic device 1400, it is to be appreciated that electronic device 1400 may also include other conventional components, such as an operating system, system busses, input/output components, and the like. Further, in other embodiments, such as in the case of a television or computer monitor, electronic device 1400 may only include a subset of the components illustrated.

Regardless of the specific implementation of electronic device 1400, electronic device 1400 includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include an array of pixels as described herein, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 10 illustrates that some examples of electronic device 1400 may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 10 further illustrates that electronic device 1400 may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400 may also store one or more content presentation applications to render content items on electronic device 1400. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400 may couple to a cover (not illustrated in FIG. 10) to protect the display 1402 (and other components in the display stack or display assembly) of electronic device 1400. In one example, the cover may include a back flap that covers a back portion of electronic device 1400 and a front flap that covers display 1402 and the other components in the stack. Electronic device 1400 and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400 includes an ambient light sensor (not illustrated in FIG. 10) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400 may implement a larger default font or a greater contrast when the light is off compared to when the light is on. In some embodiments, electronic device 1400 maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a lightguide sheet and a light source (not illustrated in FIG. 10). The lightguide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3 h pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the lightguide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 10 illustrates a few example components, electronic device 1400 may have additional features or functionality. For example, electronic device 1400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400 may reside remotely from electronic device 1400 in some implementations. In these implementations, electronic device 1400 may utilize communication interfaces 1418 to communicate with and utilize this functionality.

In an embodiment, an electrowetting display device includes a first support plate and a second support plate opposite the first support plate, and a plurality of pixel walls over the first support plate. The plurality of pixel walls are associated with an electrowetting pixel and define a volume containing at least a portion of an oil and an electrolyte fluid. The electrowetting display device includes a thin film transistor over the first support plate. The thin film transistor includes a source terminal, a drain terminal, and a semiconducting channel in contact with the source terminal and the drain terminal. The semiconducting channel includes a doped semiconducting material. The electrowetting display device includes an electrode over the first support plate. The electrode is electrically connected to the drain terminal of the thin film transistor. The electrode defines a notch region extending from a first end of the electrode towards a first pixel wall in the plurality of pixel walls. The notch region does not include any portion of the electrode and is at least partially over the thin film transistor. The electrowetting display device includes an insulated notch structure over at least part of the semiconducting channel of the thin film transistor and at least part of the notch region of the electrode. The insulated notch structure includes a dielectric layer over the first support plate, and a polymer layer over the dielectric layer.

In another embodiment, a device includes a support plate and a plurality of pixel walls over the support plate. The plurality of pixel walls are associated with an electrowetting pixel. The device includes a switch over the support plate. The switch includes a first terminal. The device includes an electrode over the support plate. The electrode is electrically connected to the first terminal of the switch. The electrode defines a notch region extending from a first end of the electrode towards a first pixel wall in the plurality of pixel walls. The device includes an insulated notch structure including a dielectric layer. The insulated notch structure is over at least a portion of the switch and at least a portion of the notch region.

In another embodiment, a device including a support plate and a plurality of pixel walls over the support plate. The plurality of pixel walls are associated with an electrowetting pixel. The electrowetting pixel includes an electrode. The device includes a switch over the support plate. The switch is electrically connected to the electrode. The device includes an insulated notch structure over at least a portion of the switch.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A device, comprising:
    a support plate;
    a plurality of pixel walls over the support plate, the plurality of pixel walls being associated with an electrowetting pixel;

a switch over the support plate, the switch including a first terminal;

an electrode over the support plate, the electrode being electrically connected to the first terminal of the switch, the electrode defining a notch region extending from a first end of the electrode towards a first pixel wall in the plurality of pixel walls, wherein the electrode is not located in the notch region; and an insulated notch structure including a dielectric layer, the insulated notch structure being over at least a portion of the switch and at least a portion of the notch region.

2. The device of claim 1, wherein the switch includes:
a first gate terminal over the support plate;
a semiconducting channel over the first gate terminal; and
a second gate terminal overlaying at least a portion of the semiconducting channel of the switch.

3. The device of claim 2, further comprising:
an insulating layer between the first gate terminal and the second gate terminal; and
a via formed through the insulating layer to electrically connect the first gate terminal to the second gate terminal.

4. The device of claim 2, wherein the second gate terminal includes aluminum, molybdenum, titanium, or copper.

5. The device of claim 2, wherein a width of the second gate terminal is equal to or greater than a width of the semiconducting channel.

6. The device of claim 1, wherein at least a portion of the switch is directly below a portion of the first pixel wall.

7. The device of claim 1, wherein the insulated notch structure includes a polymer layer over the dielectric layer.

8. The device of claim 1, wherein the insulated notch structure extends into the electrowetting pixel by a distance between a width of the first pixel wall and twice the width of the first pixel wall.

9. A device, comprising:
a support plate;
a plurality of pixel walls over the support plate, the plurality of pixel walls being associated with an electrowetting pixel, the electrowetting pixel including an electrode, wherein the electrode defines a notch region and the electrode is not located in the notch region;
a switch over the support plate, the switch being electrically connected to the electrode; and
an insulated notch structure over at least a portion of the switch and at least a portion of the notch region.

10. The device of claim 9, wherein the switch includes:
a first gate terminal over the support plate;
a semiconducting channel over the first gate terminal; and
a second gate terminal over at least a portion of the semiconducting channel of the switch.

11. The device of claim 10, further comprising:
an insulating layer between the first gate terminal and the second gate terminal; and
a via formed through the insulating layer to electrically connect the first gate terminal to the second gate terminal.

12. The device of claim 10, wherein the second gate terminal includes aluminum, molybdenum, titanium, or copper.

13. The device of claim 10, wherein a width of the second gate terminal is equal to or greater than a width of the semiconducting channel.

14. The device of claim 9, wherein at least a portion of the switch is directly below a portion of a first pixel wall in the plurality of pixel walls.

15. The device of claim 9, wherein the insulated notch structure extends into the electrowetting pixel by a distance between a width of a first pixel wall in the plurality of pixel walls and twice the width of the first pixel wall.

16. A device, comprising:
a support plate;
a plurality of pixel walls over the support plate, the plurality of pixel walls being associated with a pixel;
a switch over the support plate;
an electrode over the support plate, the electrode being electrically connected to the switch; and
an insulated notch structure including a dielectric layer, the insulated notch structure being over at least a portion of the switch and not being over the electrode.

17. The device of claim 16, wherein the electrode defines a notch region extending from a first end of the electrode towards a first pixel wall in the plurality of pixel walls and the insulated notch structure is over the notch region.

18. The device of claim 16, wherein the switch includes:
a first gate terminal over the support plate;
a semiconducting channel over the first gate terminal; and
a second gate terminal over at least a portion of the semiconducting channel of the switch.

19. The device of claim 18, wherein a width of the second gate terminal is equal to or greater than a width of the semiconducting channel.

* * * * *

UNITED STATES PATENT AND TRADEMARK OFFICE
CERTIFICATE OF CORRECTION

PATENT NO. : 10,516,057 B1
APPLICATION NO. : 15/369186
DATED : December 24, 2019
INVENTOR(S) : Toru Sakai and Abhishek Kumar Page 1 of 1

It is certified that error appears in the above-identified patent and that said Letters Patent is hereby corrected as shown below:

In the Claims

Column 27, Line 16: "overlaying at least" should be --over at least--

Signed and Sealed this
First Day of December, 2020

Andrei Iancu
*Director of the United States Patent and Trademark Office*